(12) United States Patent
Akimoto et al.

(10) Patent No.: US 7,322,756 B2
(45) Date of Patent: Jan. 29, 2008

(54) COATING AND DEVELOPING APPARATUS AND COATING AND DEVELOPING METHOD

(75) Inventors: Masami Akimoto, Kumamoto (JP); Shinichi Hayashi, Kumamoto (JP); Yasushi Hayashida, Kumamoto (JP); Nobuaki Matsuoka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 210 days.

(21) Appl. No.: 11/239,403

(22) Filed: Sep. 30, 2005

(65) Prior Publication Data

US 2006/0165408 A1 Jul. 27, 2006

(30) Foreign Application Priority Data

Jan. 21, 2005 (JP) ............................. 2005-014714

(51) Int. Cl.
*G03D 5/00* (2006.01)
(52) U.S. Cl. ...................... 396/611; 427/240; 118/52
(58) Field of Classification Search ............... 396/564, 396/611, 627; 355/27
See application file for complete search history.

(56) References Cited

U.S. PATENT DOCUMENTS 5,943,880 A 8/1999 Tateyama
5,970,717 A 10/1999 Tateyama
6,261,007 B1 7/2001 Takamori et al.
6,264,381 B1 7/2001 Ueda
6,402,400 B1 6/2002 Ueda et al.
6,471,422 B1 10/2002 Ueda et al.

FOREIGN PATENT DOCUMENTS

JP 2001-176792 6/2001
JP 2004-193597 7/2004

*Primary Examiner*—D. Rutledge
(74) *Attorney, Agent, or Firm*—Smith, Gambrell & Russell, LLP

(57) ABSTRACT

A coating and developing apparatus comprises a process block which forms a resist film on a wafer, then transfers the wafer to an exposure apparatus, and performs a developing process on the wafer after exposure, and an interface transfer mechanism provided between the process block and the exposure apparatus. The process block includes unit blocks for coating-film formation and unit blocks for development laid out in a stacked manner. When an abnormality occurs in the interface transfer mechanism, an ordinary process in the unit block for coating-film formation is performed on those substrates which are present in that unit block for coating-film formation, after which processed wafers are retreated to a retaining unit and transfer of any wafer into the unit block for coating-film formation is inhibited.

11 Claims, 15 Drawing Sheets

| FASE | COL4 | COT | CHP4 | TRS4 |
|------|------|-----|------|------|
| 1 | W1 | | | |
| 2 | W2 | W1 | | |
| 3 | W3 | W2 | W1 | |
| 4 | W4 | W3 | W2 | W1 |

FIG.13

| FASE | COL4 | COT | CHP4 | 4 |
|------|------|-----|------|---|
| 1 | W1 | | | |
| 2 | W2 | W1 | | |
| 3 | W3 | W2 | W1 | |
| 4 | W4 | W3 | W2 | W1 |

FIG.14

COATING AND DEVELOPING APPARATUS AND COATING AND DEVELOPING METHOD

BACKGROUND OF THE INVENTION

1. Field of the Invention

The present invention relates to a coating and developing apparatus, and a coating and developing method, which perform a coating process of applying a resist liquid or the like to a substrate, such as a semiconductor wafer or a glass substrate for liquid crystal display (LCD substrate), and a developing process on the substrate after exposure.

2. Description of the Related Art

In a fabrication process of a semiconductor device or an LCD substrate, a resist pattern is formed on a substrate using a technology called photolithography. According to the technology, a resist liquid is applied to the top surface of a substrate, such as a semiconductor wafer, to form a liquid film, which is then dried to be a resist film, the resist film is exposed into a desired pattern using a photomask, and then a developing process is performed to yield a resist pattern corresponding to the exposure pattern.

Such a sequence of processes is generally carried out by using a resist pattern forming apparatus that has an exposure apparatus connected to a coating and developing apparatus which applies and dries a resist liquid. One example of such an apparatus is disclosed in Unexamined Japanese Patent Application KOKAI Publication No. 2004-193597.

The apparatus disclosed in the publication includes a carrier block 1A, a process block 1B, an interface block 1C and an exposure apparatus 1D, as shown in FIG. 1. In the apparatus, carriers 10 each retaining multiple wafers W are carried onto a carrier stage 11 of the carrier block 1A, and the wafers in the carrier 10 are transferred to the process block 1B. Then, the wafers are transferred to a coating unit 13a in the process block 1B, a resist liquid is applied to the wafers, and then the wafers are transferred the exposure apparatus 1D via the interface block 1C. The wafers after exposure are returned to the process block 1B again, and are transferred to a developing unit 13b to undergo a developing process, after which the wafers are returned into the original carrier 10.

Referring to FIG. 1, reference numerals 14a to 14c denote shelf units which comprise a multilevel of heating units, cooling units, transfer stages and so forth for performing a predetermined heating process and cooling process on wafers before and after the processing of the coating unit 13a and the processing of the developing unit 13b. The wafers W are transferred between modules in the process block 1B where the wafers W are to be placed, such as individual sections like the coating unit 13a, the developing unit 13b and the shelf units 14a to 14c, by two transfer devices 15a and 15b provided in the process block 1B. The interface block 1C is provided with transfer mechanisms 16a and 16b which transfer wafers W between the process block 1B and the exposure apparatus 1D.

Unexamined Japanese Patent Application KOKAI Publication No. 2004-193597 describes that at the time wafers W are subjected to the processes, all the wafers W to be processed are transferred according to a transfer schedule that specifies at which timing each wafer is to be transferred to which module.

The transfer schedule is made in such a way that after a wafer W is transferred to modules, which perform processes preceding exposure, in order using the two transfer devices 15a and 15b in the process block 1B, the wafer is then transferred to the interface block 1C, and a wafer after exposure is received from the interface block 1C and is transferred to modules, which perform processes following exposure, in order. As the transfer devices 15a and 15b go round in the process block 1B, one transfer cycle is executed, and a new wafer W carried out from the carrier 10 is transferred into the process block 1B every transfer cycle.

Such a resist pattern forming apparatus may come across a case where the a wafer W cannot be received from the process block 1B or cannot be transferred to the process block 1B at the timing set in the transfer schedule upon occurrence of some kind of abnormality, such as failure of the transfer mechanisms 16a and 16b provided in the interface block 1C, or collision of the transfer mechanisms 16a and 16b against the transfer stage, or slight delay in carrying out a wafer from the exposure apparatus 1D.

According to the resist pattern forming apparatus described in the Japanese publication, when such a situation occurs, the operations of the transfer devices 15a and 15b are stopped for the following reason. As the transfer program is complex, if the transfer devices 15a and 15b are allowed to retreat in the transfer path, the transfer program becomes extremely complicated, which is not practical.

If the transfer devices 15a and 15b stop, however, a wafer W is not removed from each module and is left inside the module. If a wafer W is left remaining in a module this way, various problems occur. When a wafer W processed in the coating unit 13a is left remaining in the coating unit 13a, for example, the quality of the coated resist film is degraded, so that even when wafer transfer with the transfer devices 15a and 15b is resumed thereafter, the predetermined quality of the resist film cannot be guaranteed. A wafer W left inside each module often hardly meets a predetermined quality, in which case the wafer cannot be delivered as a product, thus reducing the yield.

With the recent improvement of the throughput of exposure apparatuses, a coating and developing apparatus is demanded of the processing performance that matches with the throughput of exposure apparatuses. One possible approach studied is to arrange an area to store modules before exposure and an area to store modules after exposure, one above the other, and provide transfer means in each area to lower the load of the transfer means and enhance the transfer efficiency, thereby improving the throughput of exposure apparatuses. Japanese Patent No. 3337677, for instance, discloses the structure where an area for performing a coating process and an area for performing a developing process are laid one on the other and transfer means is provided in each area.

Even with the structure, wafers W are transferred between the coating and developing apparatus and the exposure apparatus by a transfer mechanism provided in the interface block, and wafers W are transferred in each area according to the transfer schedule by a transfer mechanism provided in that area. When some kind of abnormality occurs in the transfer mechanism provided in the interface block, therefore, the aforementioned problem may come up. The publication gives no description of any means to overcome the problem.

BRIEF SUMMARY OF THE INVENTION

Accordingly, it is an object of the present invention to provide a coating and developing apparatus, and a coating and developing method, which can perform an ordinary process on a substrate in a process block when an abnormality occurs in a transfer mechanism which transfers substrates to and from an exposure apparatus, thereby suppressing reduction in the yield of substrates.

It is another object of the invention to provide a computer readable storage medium and a computer program, which execute processes in such a coating and developing apparatus.

According to the first aspect of the invention, there is provided a coating and developing apparatus comprising:

a carrier block for carrying in and out a carrier on which a plurality of substrates are mountable;

a process block in which a substrate in said carrier carried into the carrier block is transferred, and which forms a coating film including a resist film on a substrate, develops the coating film after exposure, and performs a heat processing accompanying those film formation and development; and an interface block, provided between the process block and an exposure apparatus which performs an exposure process on the coating film formed on a substrate, for transferring the substrate between the process block and the exposure apparatus, wherein after the coating film including the resist film is formed on a substrate transferred to the process block from said carrier, the substrate is transferred to the exposure apparatus via said interface block, and the substrate after exposure is returned to the process block via the interface block and is subjected to a developing process in the process block, after which the substrate is transferred to the carrier block, the process block includes a unit block for coating-film formation or a stack of plural unit blocks for coating-film formation, and a unit block for development stacked on the unit block for coating-film formation or the plural unit blocks for coating-film formation, the unit block for coating-film formation or each of the unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of the unit blocks for coating-film formation and retainable substrates whose quantity corresponds to a number of substrates retainable in that unit block, and the coating and developing apparatus further comprises a second transfer mechanism, intervened between said process block and the exposure apparatus, for transferring a substrate therebetween, and a control device which, upon occurrence of an abnormality in the second transfer mechanism, outputs a control instruction to control the first transfer mechanism in the unit block for coating-film formation in such a way that those substrates which are present in that unit block for coating-film formation retreat to the first substrate retaining section after an ordinary process is performed in the unit block for coating-film formation, and inhibit transfer of any substrate into the unit block for coating-film formation.

The coating and developing apparatus can be designed in such a way as to further comprise a second substrate retaining section for retreat, provided at the unit block for development and retainable substrates whose quantity corresponds to a number of substrates retainable in that unit block, and a third transfer mechanism which carries out substrates after development from the unit block for development, and wherein upon occurrence of an abnormality in the third transfer mechanism, the control device outputs a control instruction to control the first transfer mechanism in the unit block for development in such a way that those substrates which are present in that unit block for development retreat to the second substrate retaining section after an ordinary process is performed in the unit block for development, and inhibit transfer of any substrate into the unit block for development.

In the coating and developing apparatus, the plural unit blocks for coating-film formation stacked one on another may include a unit block for applying a resist liquid to a substrate, and a unit block for applying a chemical liquid for an antireflection film to a substrate before applying the resist liquid. The plural unit blocks for coating-film formation stacked one on another may include a unit block for applying a resist liquid to a substrate, and a unit block for applying a chemical liquid for an antireflection film to a substrate after applying the resist liquid. Further, the plural unit blocks for coating-film formation stacked one on another may include a unit block for applying a resist liquid to a substrate, a unit block for applying a chemical liquid for an antireflection film to a substrate before applying the resist liquid, and a unit block for applying a chemical liquid for an antireflection film to a substrate after applying the resist liquid.

The coating and developing apparatus can take such a structure that the unit block for coating-film formation has a plurality of modules on which substrates are to be mounted and whose transfer order has been determined, the first transfer mechanism has two transfer arms, takes out a substrate from one of the plurality of modules with one of the transfer arms, receives another substrate present in a next module with the other transfer arm, transfers the former substrate on the one transfer arm to the next module, repeats those operations to move a substrate placed on each module to a module succeeding that module by one to thereby execute one transfer cycle, goes to a next transfer cycle after the one transfer cycle is executed, and executes individual transfer cycles in order to sequentially transfer substrates to the plurality of modules in the transfer order, so that a predetermined coating-film forming process is performed on the substrates, and the control device comprises:

a memory section which stores a transfer schedule in a unit block for coating-film formation, which is prepared by arranging transfer cycle data, designating a transfer cycle in association with an order assigned to substrates and modules in that unit block for coating-film formation, in a time sequential manner;

a rewriting section which rewrites a last module in the transfer schedule in the first substrate retaining section when an abnormality occurs in the second transfer mechanism; and transfer control section which controls transfer of substrates by the first transfer mechanism in the unit block for coating-film formation according to the transfer schedule or a rewritten transfer schedule.

The coating and developing apparatus can take such a structure that the unit block for development has a plurality of modules on which substrates are to be mounted and whose transfer order has been determined, the first transfer mechanism has two transfer arms, takes out a substrate from one of the plurality of modules with one of the transfer arms, receives another substrate present in a next module with the other transfer arm, transfers the former substrate on the one transfer arm to the next module, repeats those operations to move a substrate placed on each module to a module succeeding that module by one to thereby execute one transfer cycle, goes to a next transfer cycle after the one transfer cycle is executed, and executes individual transfer cycles in order to sequentially transfer substrates to the plurality of modules in the transfer order, so that a predetermined coating-film forming process is performed on the substrates, and the control device comprises:

a memory section which stores a transfer schedule in a unit block for coating-film formation, which is prepared by arranging transfer cycle data, designating a transfer cycle in association with an order assigned to substrates and modules in that unit block for coating-film formation, in a time sequential manner;

a rewriting section which rewrites a last module in the transfer schedule in the second substrate retaining section when an abnormality occurs in the third transfer mechanism; and transfer control section which controls transfer of substrates by the first transfer mechanism in the unit block for development according to the transfer schedule or a rewritten transfer schedule.

According to the second aspect of the invention, there is provided a coating and developing method which performs a coating and developing process using a coating and developing apparatus comprising:

a carrier block for carrying in and out a carrier on which a plurality of substrates are mountable;

a process block in which a substrate in the carrier carried into the carrier block is transferred, and which forms a coating film including a resist film on the substrate, develops the coating film after exposure, and performs a heat processing accompanying those film formation and development; and an interface block, provided between the process block and an exposure apparatus which performs an exposure process on a coating film formed on a substrate, for transferring the substrate between the process block and the exposure apparatus, wherein the process block includes a unit block for coating-film formation or a stack of plural unit blocks for coating-film formation, and a unit block for development stacked on the single unit block for coating-film formation or the plural unit blocks for coating-film formation, the unit block for coating-film formation or each of the unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of the unit blocks for coating-film formation and retainable substrates whose quantity corresponds to a number of substrates retainable in that unit block, and the coating and developing apparatus further comprises a second transfer mechanism, intervened between the process block and the exposure apparatus, for transferring a substrate therebetween, the method comprising:

transferring a substrate into the process block from the carrier;

forming a coating film including a resist film on the substrate in the unit block for coating-film formation;

transferring the substrate to the exposure apparatus via the interface block;

returning the substrate after exposure to the process block via the interface block;

performing a developing process in the unit block for coating-film formation;

wherein upon occurrence of an abnormality in the second transfer mechanism, an ordinary process in the unit block for coating-film formation is performed on those substrates which are present in that unit block for coating-film formation, individual substrates are retreated to the first substrate retaining section for retreat provided in the unit block for coating-film formation, and transfer of any substrate into the unit block for coating-film formation is inhibited.

The coating and developing method can be designed in such a way that the coating and developing apparatus further comprises a second substrate retaining section for retreat, provided at the unit block for development and retainable substrates whose quantity corresponds to a number of substrates retainable in that unit block, and a third transfer mechanism which carries out substrates after development from the unit block for development, and wherein upon occurrence of an abnormality in the third transfer mechanism, an ordinary process in the unit block for development is performed on those substrates which are present in that unit block for development, individual substrates are retreated to the second substrate retaining section for retreat provided in the unit block for development, and transfer of any substrate into the unit block for development is inhibited.

According to the third aspect of the invention, there is provided a computer readable storage medium containing software which, when executed, causes a computer to control a coating and developing apparatus comprising:

a carrier block for carrying in and out a carrier on which a plurality of substrates are mountable;

a process block in which a substrate in the carrier carried into the carrier block is transferred, and which forms a coating film including a resist film on the substrate, develops the coating film after exposure, and performs a heat processing accompanying those film formation and development; and an interface block, provided between the process block and an exposure apparatus which performs an exposure process on a coating film formed on a substrate, for transferring the substrate between the process block and the exposure apparatus, wherein the process block includes a unit block for coating-film formation or a stack of plural unit blocks for coating-film formation, and a unit block for development stacked on the unit block for coating-film formation or the plural unit blocks for coating-film formation, the unit block for coating-film formation or each of the unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of the unit blocks for coating-film formation and retainable substrates whose quantity corresponds to a number of substrates retainable in that unit block, and the coating and developing apparatus further comprises a second transfer mechanism, intervened between the process block and the exposure apparatus, for transferring a substrate therebetween, wherein the software causes said computer to control the coating and developing apparatus in such a way that upon occurrence of an abnormality in the second transfer mechanism, an ordinary process in said unit block for coating-film formation is performed on those substrates which are present in that unit block for coating-film formation, individual substrates are retreated to said first substrate retaining section for retreat provided in said unit block for coating-film formation, and transfer of any substrate into the unit block for coating-film formation is inhibited.

The computer readable storage medium can be constructed in such a way that the coating and developing apparatus further comprises a second substrate retaining section for retreat, provided at the unit block for development and retainable substrates whose quantity corresponds to a number of substrates retainable in that unit block, and a third transfer mechanism which carries out substrates after development from the unit block for development, and wherein the software causes the computer to control the coating and developing apparatus in such a way that upon occurrence of an abnormality in the third transfer mechanism, an ordinary process in the unit block for development is performed on those substrates which are present in that unit block for development, individual substrates are retreated to the second substrate retaining section for retreat provided in the unit block for development, and transfer of any substrate into the unit block for development is inhibited.

According to the fourth aspect of the invention, there is provided a computer program containing software which, when executed, causes a computer to control a coating and developing apparatus comprising:

a carrier block for carrying in and out a carrier on which a plurality of substrates are mountable;

a process block in which a substrate in the carrier carried into the carrier block is transferred, and which forms a coating film including a resist film on the substrate, develops said coating film after exposure, and performs a heat processing accompanying those film formation and development; and an interface block, provided between said process block and an exposure apparatus which performs an exposure process on a coating film formed on a substrate, for transferring the substrate between the process block and the exposure apparatus, wherein the process block includes a unit block for coating-film formation or a stack of plural unit blocks for coating-film formation, and a unit block for development stacked on the unit block for coating-film formation or the plural unit blocks for coating-film formation, the unit block for coating-film formation or each of the unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of the unit blocks for coating-film formation and retainable substrates whose quantity corresponds to a number of substrates retainable in that unit block, and the coating and developing apparatus further comprises a second transfer mechanism, intervened between said process block and said exposure apparatus, for transferring a substrate therebetween, wherein thed software causes said computer to control said coating and developing apparatus in such a way that upon occurrence of an abnormality in the second transfer mechanism, an ordinary process in the unit block for coating-film formation is performed on those substrates which are present in that unit block for coating-film formation, individual substrates are retreated to said first substrate retaining section for retreat provided in the unit block for coating-film formation, and transfer of any substrate into the unit block for coating-film formation is inhibited.

The computer program can be structured in such a way that the coating and developing apparatus further comprises a second substrate retaining section for retreat, provided at the unit block for development and retainable substrates whose quantity corresponds to a number of substrates retainable in that unit block, and a third transfer mechanism which carries out substrates after development from the unit block for development, and wherein the software causes the computer to control the coating and developing apparatus in such a way that upon occurrence of an abnormality in the third transfer mechanism, an ordinary process in the unit block for development is performed on those substrates which are present in that unit block for development, individual substrates are retreated to the second substrate retaining section for retreat provided in the unit block for development, and transfer of any substrate into the unit block for development is inhibited.

According to the present invention, when an abnormality occurs in the second transfer mechanism intervened between the process block and the exposure apparatus, the first transfer mechanism in the unit block for coating-film formation is controlled in such a way that those substrates which are present in that unit block for coating-film formation retreat to the first substrate retaining section after an ordinary process is performed in the unit block for coating-film formation, and transfer of any substrate into the unit block for coating-film formation is inhibited. Accordingly, even when an abnormality occurs in the second transfer mechanism, the unit block for coating-film formation can finish a scheduled process on a substrate in the unit block. Therefore, any substrate will not be left remaining in each unit in the unit block, such as a liquid process unit or a heating unit, thereby preventing the quality of the coating film from being degraded as a consequence of the otherwise possible case where a next process cannot be performed at a set timing.

BRIEF DESCRIPTION OF THE SEVERAL VIEWS OF THE DRAWINGS

FIG. 13 is an explanatory diagram illustrating one example of a transfer schedule;

FIG. 14 is an explanatory diagram illustrating one example of a transfer schedule in which a module has been rewritten;

DETAILED DESCRIPTION OF THE INVENTION

A preferred embodiment of the present invention will now be described referring to the accompanying drawings.

Figure 1:
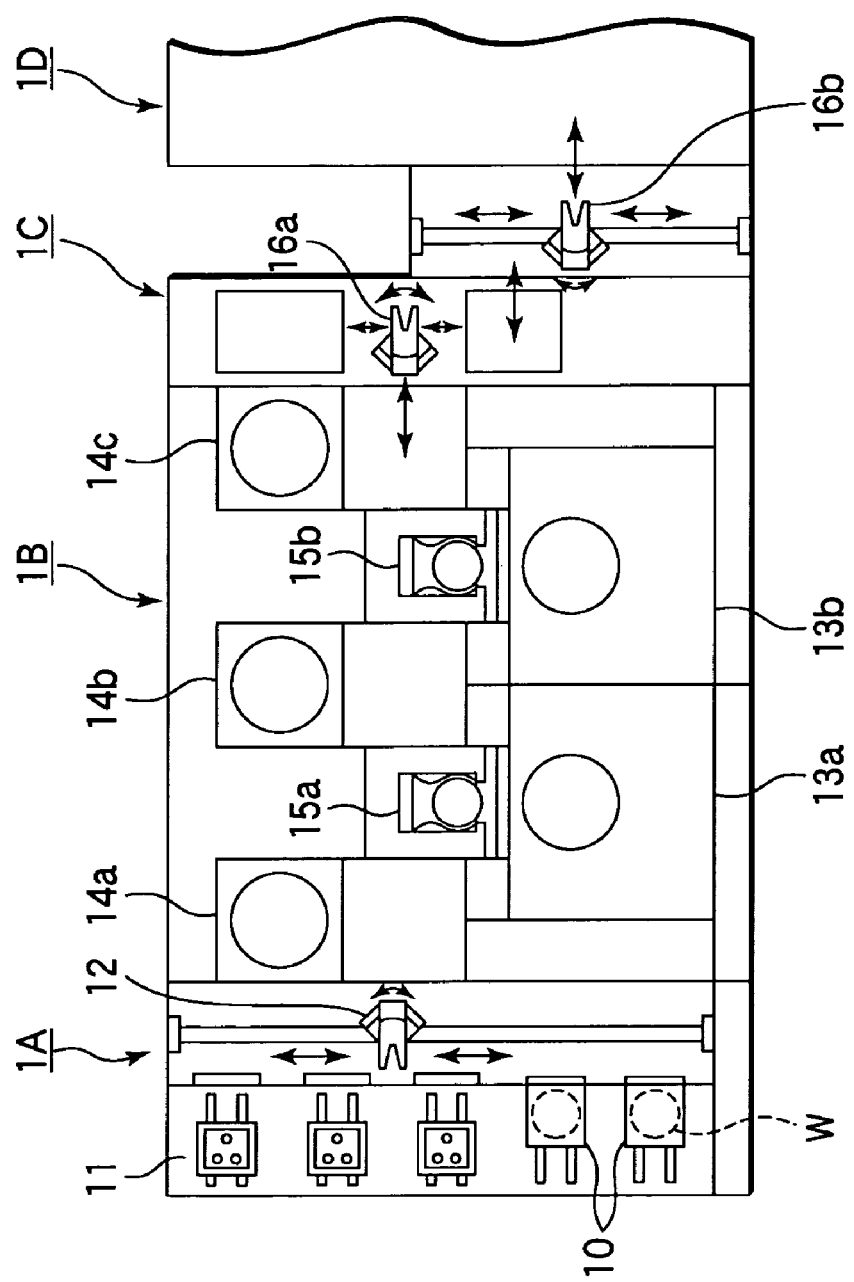
FIG. 1 is a plan view showing a coating and developing apparatus according to the prior art.
Figure 2:
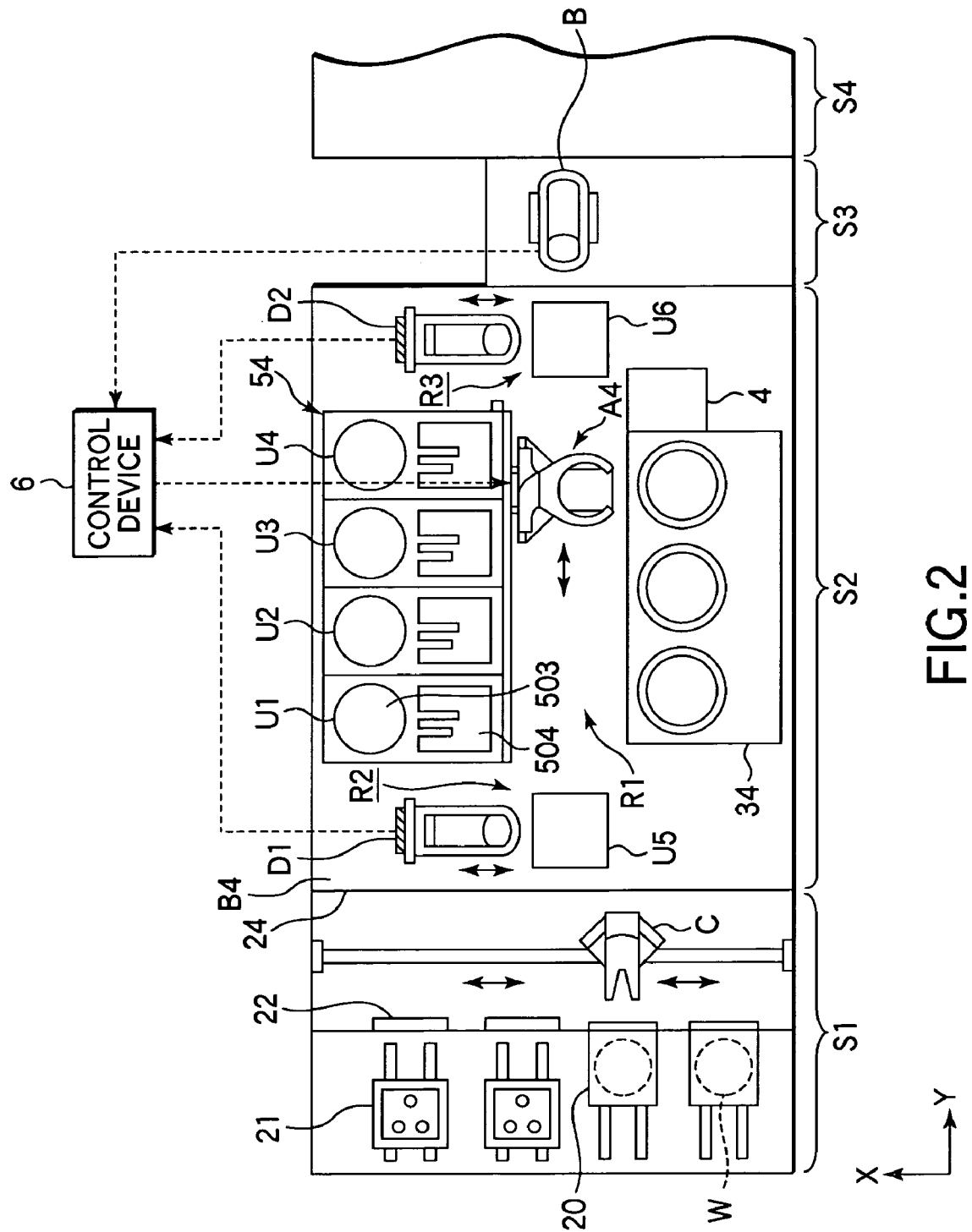
FIG. 2 is a plan view showing a coating and developing apparatus according to one embodiment of the present invention.
Figure 3:
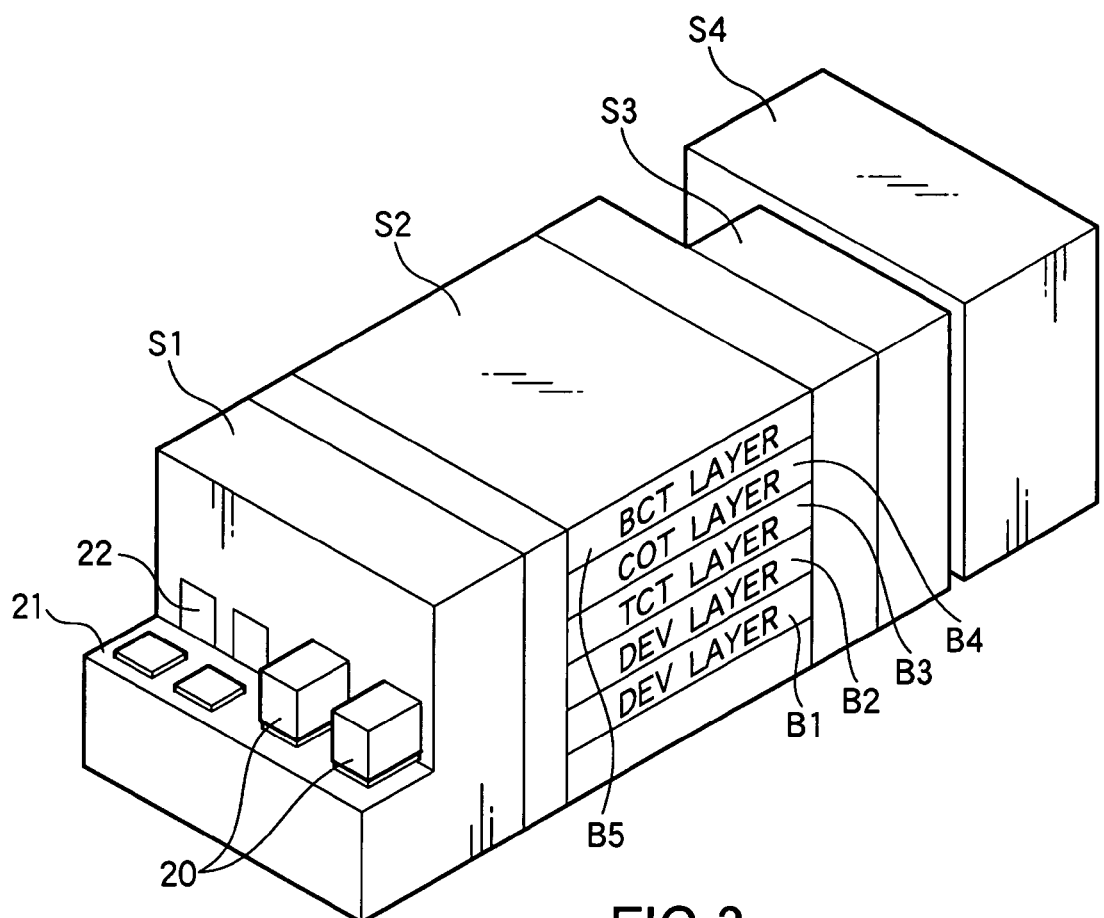
FIG. 3 is a perspective view showing the coating and developing apparatus in FIG. 2.
Figure 4:
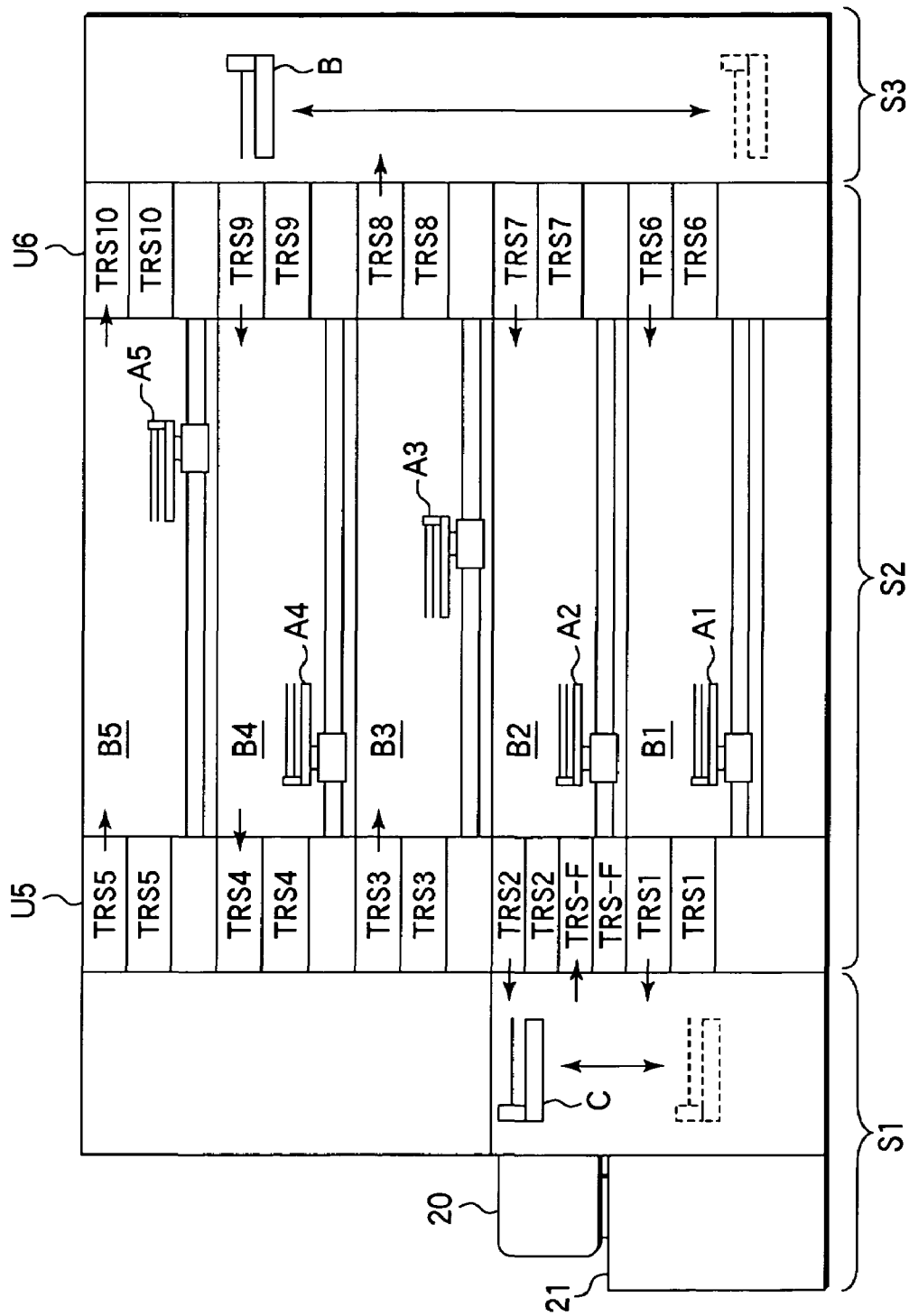
FIG. 4 is a schematic vertical cross-sectional view showing the coating and developing apparatus in FIG. 2.

FIG. 2 is a plan view showing a resist pattern forming apparatus equipped with a coating and developing apparatus according to one embodiment of the present invention, FIG. 3 is a schematic perspective view of the coating and developing apparatus, and FIG. 4 is a schematic side view of the coating and developing apparatus. The coating and developing apparatus comprises a carrier block S1 which carries in and out carriers 20 each retaining, for example, thirteen wafers W or substrates in an airtight manner, a process block S2 provided adjacent to the carrier block S1 and having five unit blocks B1 to B5, and an interface block S3 provided on the opposite side of the process block S2 to the carrier block S1. The resist pattern forming apparatus has an exposure apparatus S4 connected to the interface block S3. The operation of the resist pattern forming apparatus is controlled by a control device 6 comprising a computer.

The carrier block S1 includes a table 21 where a plurality of carriers 20 can be mounted, an opening/closing section 22 provided on the front wall as seen from the table 21, and a carrier-block transfer mechanism C which carries wafers W out of the carrier 20 via the opening/closing section 22. The carrier-block transfer mechanism C is so constructed as to be movable forward and backward, liftable, rotatable about the vertical axis, and movable in the layout direction of the carriers 20.

The process block S2, connected to the carrier block S1, is surrounded by a casing 24. The process block S2 has a multistage structure where lower two stages are first and second unit blocks (DEV layers) B1 and B2 which perform a developing process, and a third unit block (TCT layer) B3, which performs a process of forming an antireflection film above a resist film (the antireflection film will be hereinafter called "second antireflection film"), a fourth unit block (COT layer) B4, which performs a process of coating a resist liquid, and a fifth unit block (BCT layer) B5, which performs a process of forming an antireflection film under the resist film (the antireflection film will be hereinafter called "first antireflection film"), are formed in order above the first and second unit blocks B1 and B2. The DEV layers B1 and B2 are equivalent to unit blocks for development, and the TCT layer B3, the COT layer B4 and the BCT layer B5 are equivalent to unit blocks for coating-film formation.

The process block S2 has a shelf unit U5 on its carrier block S1 side and has a plurality of transfer stages placed one on the other and penetrating through the unit blocks B1 to B5, and has a shelf unit U6 on its interface block S3 side and has a plurality of transfer stages placed one on the other and penetrating through the unit blocks B1 to B5.

Next, the structures of the first to fifth unit blocks B1 to B5 will be discussed.

Each of those unit blocks B1 to B5 has a liquid process unit for coating a chemical liquid on wafers W, and a plurality of process units of various processing systems, such as heating and cooling, which perform a pre-process and a post-process to the process that is executed by the liquid process unit. Each of the unit blocks B1 to B5 also has exclusive main transfer arms or transfer mecanisms A1 to A5 for transferring wafers W between the liquid process unit and the heating and cooling units.

As the unit blocks B1 to B5 are constructed in nearly the same layouts, the fourth unit block (COT layer) B4 shown in FIG. 2 will be discussed as a representative example.

A transfer area R1 for wafers W is formed at nearly the center of the COT layer B4 in such a way as to extend from the carrier block S1 side to the interface block S3 side along the Y direction in the diagram. A coating unit 34 having a plurality of coating sections for performing resist coating is provided as the liquid process unit on the right-hand side of the transfer area R1 as seen from the carrier block S1 side, and a heating and cooling section 54 is provided on the left-hand side of the transfer area R1. The heating and cooling section 54 includes four shelf units U1, U2, U3 and U4 provided in order from the carrier block S1 side and having heating and cooling units multistaged.

A retaining unit 4 which serves as a first substrate retaining section is provided on the interface block S3 side of the coating unit 34. The retaining unit 4 has multiple stages for retaining wafers W whose quantity corresponds to the number of wafers W to be retained in the fourth unit block (COT layer) B4.

Each of the shelf units U1 to U4 of the heating and cooling section 54 has a multistage structure of various units for performing a pre-process and a post-process to the process which is performed in the coating unit 34, for example, a two-stage structure.

The transfer area R1 is defined by the heating and cooling section 54 and the coating unit 34. As the transfer area R1 defined thus is exhausted by supplying fresh air into the transfer area R1, floating of particles in the transfer area R1 is suppressed.

A plurality of process units which constitute the heating and cooling section 54 and perform a pre-process and a post-process includes a cooling unit (COL4) for adjusting the temperature of wafers W to a predetermined temperature before coating a resist liquid, a heating unit (CHP4) called a prebaking unit or so for performing a heating process on wafers W after coating of the resist liquid, and a periphery exposure apparatus (WEE) for selectively exposing only the edge portions of a wafer W. Those process units, such as the cooling unit (COL4) and the heating unit (CHP4), are accommodated in a process container 501. Each of the shelf units U1 to U4 is constructed by two process containers 501 stacked one on the other, and a wafer transfer inlet/output port 502 is formed in that side of each process container 501 which faces the transfer area R1.

The main transfer mechanism A4 is provided in the transfer area R1. The main transfer mechanism A4 is constructed in such a way as to transfer wafers among all the modules (where wafers W are to be placed) in the fourth unit block (COT layer) B4, such as plural process units of the shelf units U1 to U4, plural coating units of the coating unit 34, individual stages of the retaining unit 4, and individual transfer stages of the shelf unit U5 and the shelf unit U6. For this purpose, the main transfer mechanism A4 is so constructed as to be movable forward and backward, liftable, rotatable about the vertical axis, and movable in the Y-axial direction.

That area of the transfer area R1 which is adjacent to the carrier block S1 is a first wafer transfer area R2. As shown in FIGS. 2 and 4, the shelf unit U5 is provided at that position in the area R2 where the carrier-block transfer mechanism C and the main transfer mechanism A4 can access. A first sub-transfer mechanism D1 for transferring a wafer W to and from the shelf unit U5 can pass through the area R2. The first sub-transfer mechanism D1 is movable up and down, penetrating the first to fifth unit blocks B1 to B5 along the shelf unit U5.

That area of the transfer area R1 which is adjacent to the interface block S3 is a second wafer transfer area R3. As shown in FIGS. 2 and 4, the shelf unit U6 is provided at that position in the area R3 where the main transfer mechanism A4 can access. A second sub-transfer mechanism D2 for transferring a wafer W to and from the shelf unit U6 can pass through the area R3. The second sub-transfer mechanism D2 is movable up and down, penetrating the first to fifth unit blocks B1 to B5 along the shelf unit U6.

Figure 6:
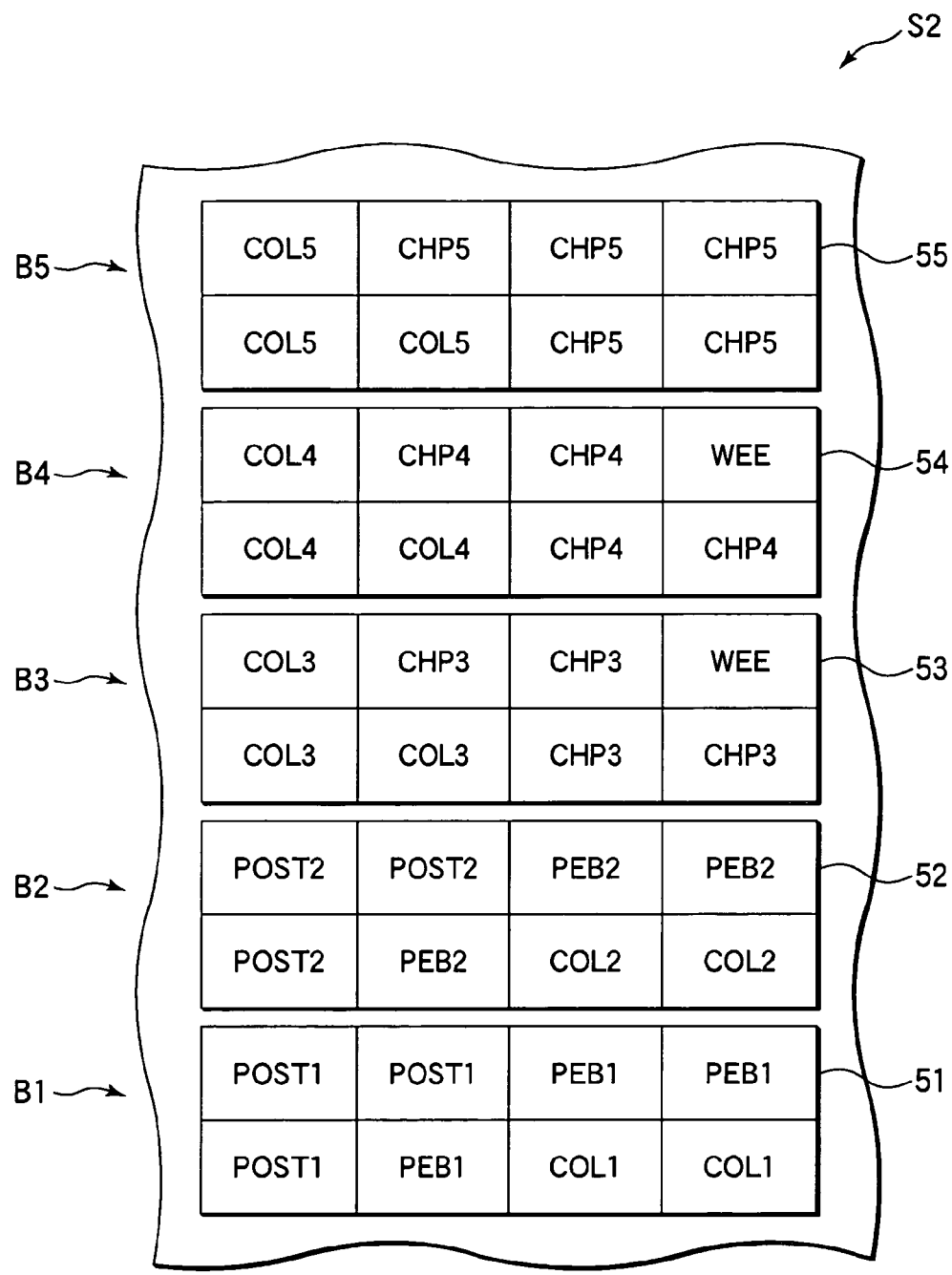
FIG. 6 is a front view showing a heating and cooling section provided in a unit block in the coating and developing apparatus in FIG. 2.
Figure 8:
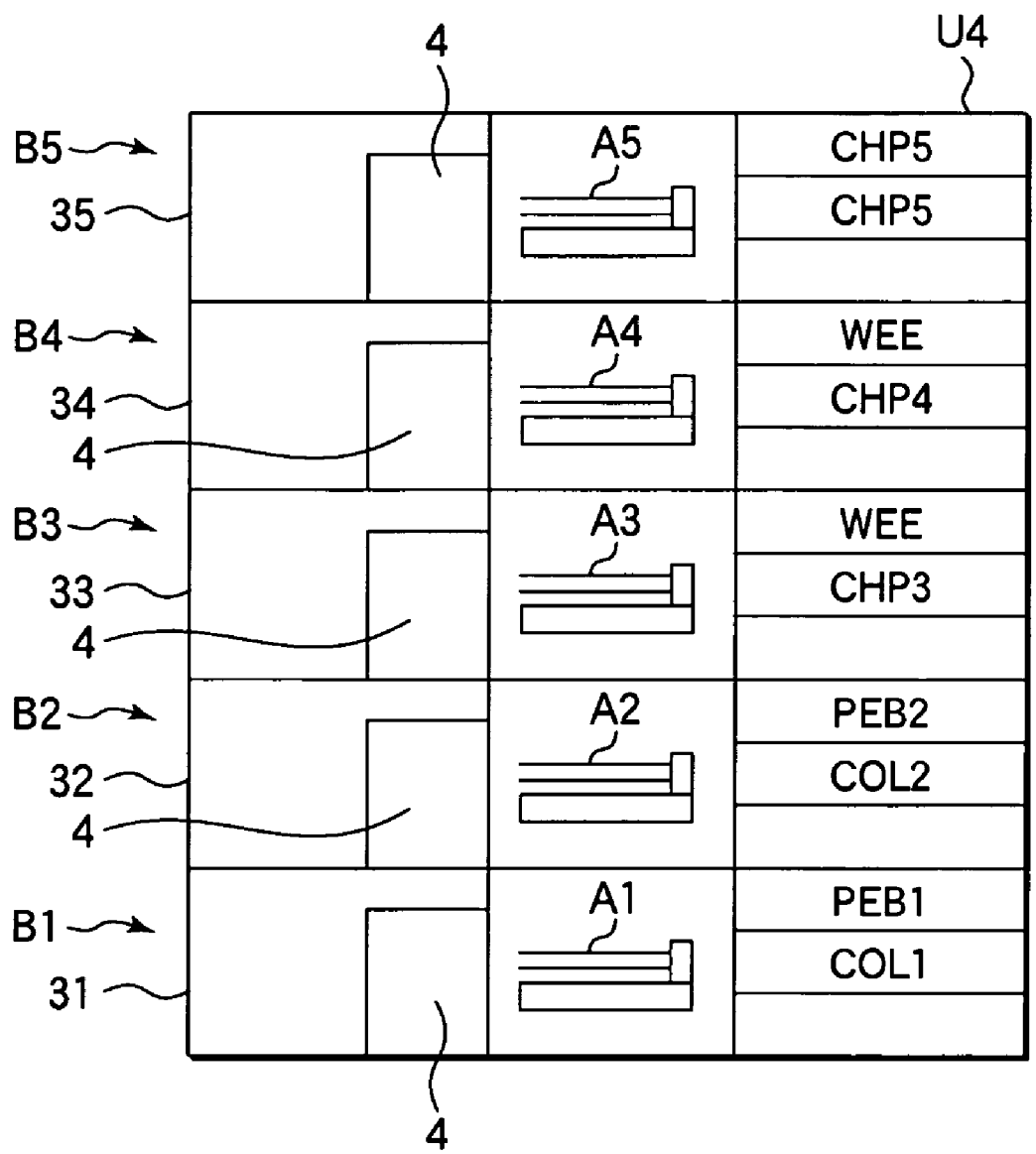
FIG. 8 is a schematic view showing the coating and developing apparatus in FIG. 2 from the interface block side.
Figure 9:
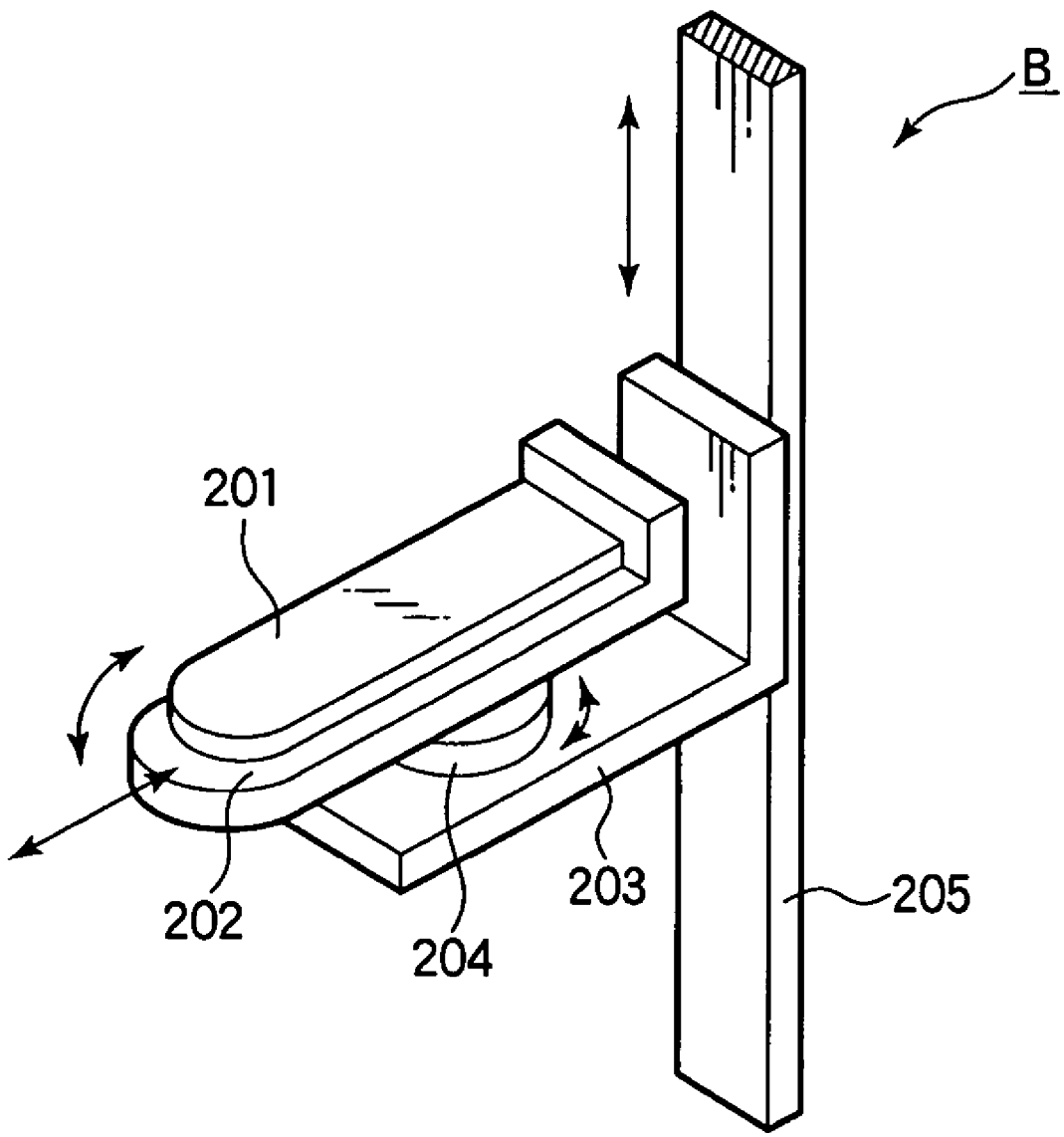
FIG. 9 is a perspective view showing an example of an interface transfer mechanism in the coating and developing apparatus in FIG. 2.

The above is the discussion of the structure of the fourth unit block B4. While the other unit blocks B1, B2, B3 and B5 have nearly the same basic structures as that of the fourth unit block B4 as mentioned above, they differ from the fourth unit block B4 in the following points as shown in FIGS. 6 and 8. FIG. 6 is a view of the heating and cooling sections of the unit blocks B1 to B5 in the process block S2 as seen from the transfer area R1 side, and FIG. 8 is a view of the process block S2 as seen from the interface block S3 side.

A developing unit 31, a developing unit 32, a second antireflection-film forming unit 33 and a first antireflection-film forming unit 35 are provided as liquid process units in those portions in each of the unit blocks B1, B2, B3 and B5 which correspond to the coating unit 34 of the fourth unit block B4. In those portions in each of the unit blocks B1, B2, B3 and B5 which correspond to the heating and cooling section 54, heating and cooling sections 51, 52, 53 and 55 having process units according to the associated processes are provided. Each of the heating and cooling sections 51, 52, 53 and 55, like the heating and cooling section 54, has shelf units U1 to U4 each having two predetermined units placed one on the other. The structure of each of the unit blocks B1 to B5 will be discussed later.

The shelf unit U5 has first transfer stages TRS1 to TRS5, two each, at the positions corresponding to the unit blocks B1 to B5, as shown in FIG. 4. The first transfer stages TRS1 to TRS5 transfer wafers W to and from the main transfer mechanisms A1 to A5 of the respective unit blocks B1 to B5. The first sub-transfer mechanism D1 is so constructed as to be movable forward and backward and liftable to be able to transfer wafers W to and from the first transfer stages TRS1 to TRS5. Although the first transfer stages TRS1 to TRS5 are provided, two each, in this embodiment, they may be provided, one each, or three or more each.

The first transfer stages TRS1 and TRS2 of the first and second unit blocks B1 and B2 are is constructed in such a way as to transfer wafers W to and from the carrier-block transfer mechanism C of the carrier block S1. The shelf unit U5 further includes two transfer stages TRS-F at portions corresponding to the second unit block B2, and the transfer stages TRS-F are used as exclusive transfer stages with which the carrier-block transfer mechanism C transfers wafers W into the process block S2. The transfer stages TRS-F may be provided in the first unit block B1. Without the transfer stages TRS-F provided separately, wafers W may be transferred into the process block S2 from the carrier-block transfer mechanism C using the first transfer stages TRS1, TRS2. In this embodiment, the carrier-block transfer mechanism C is equivalent to the transfer mean for carrying out wafers after the developing process from the first and second unit blocks B1, B2 for development.

Figure 7:
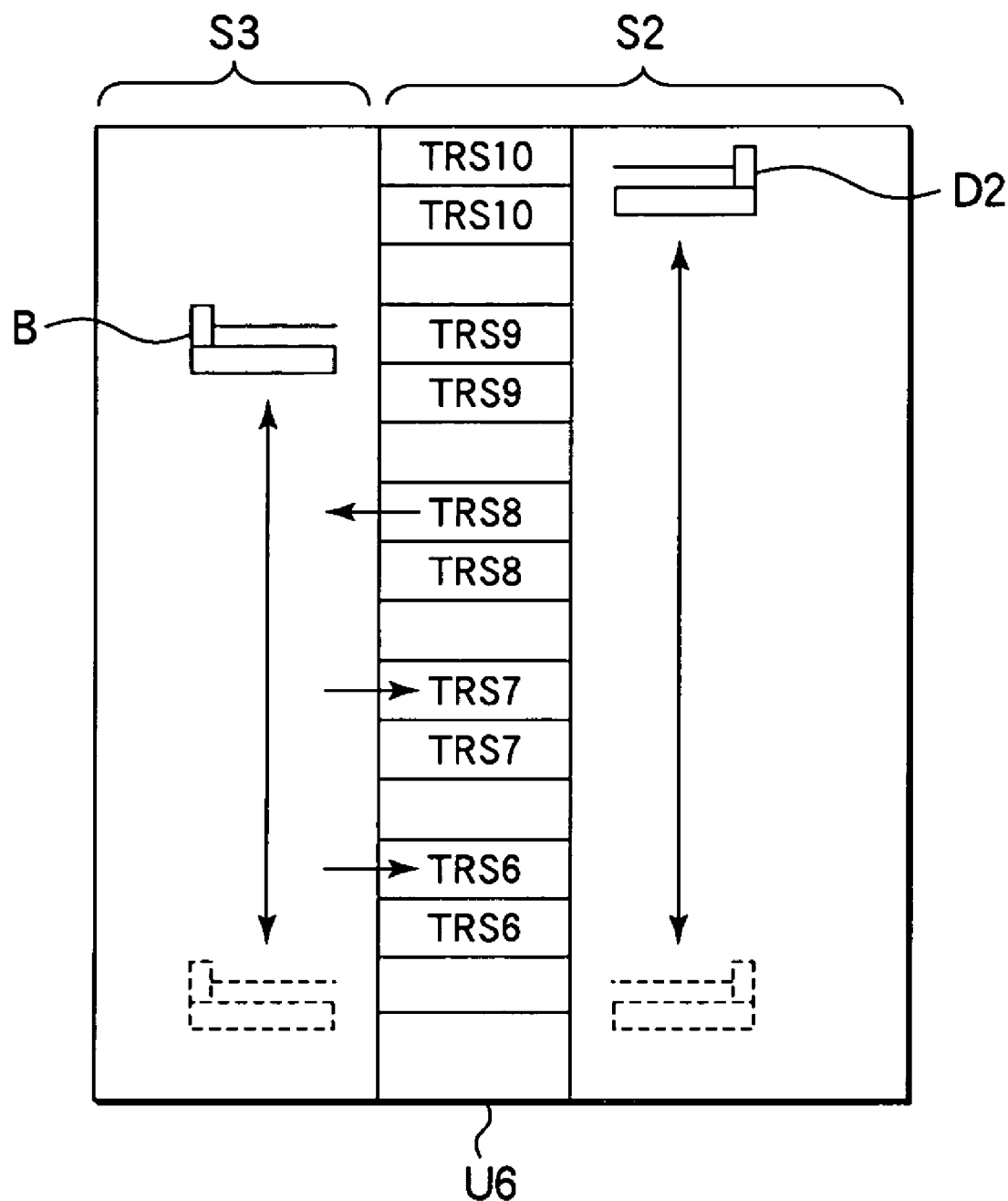
FIG. 7 is a schematic vertical cross-sectional view showing an interface block in the coating and developing apparatus in FIG. 2.

The shelf unit U6 has second transfer stages TRS6 to TRS10, two each, at the positions corresponding to the unit blocks B1 to B5, as shown in FIGS. 4 and 7. The second transfer stages TRS6 to TRS10 transfer wafers W to and from the main transfer mechanisms A1 to A5 of the respective unit blocks B1 to B5. The second sub-transfer mechanism D2 is so constructed as to be movable forward and backward and liftable to be able to transfer wafers W to and from the second transfer stages TRS6 to TRS10. Although the second transfer stages TRS6 to TRS10 are provided, two each, in this embodiment, they may be provided, one each, or three or more each.

The embodiment is designed in such a way that wafers W can be transferred freely among the unit blocks B1 to B5, multileveled in five stages, by the first sub-transfer mechanism D1 and the second sub-transfer mechanism D2 via the first transfer stages TRS1 to TRS5 and the second transfer stages TRS6 to TRS10.

The structures of the other unit blocks than the fourth unit block (COT layer) B4 will now be discussed referring to FIGS. 6 and 8.

The first and second unit blocks (DEV layers) B1 and B2 are respectively provided, as liquid process units, with the developing units 31 and 32 for performing a developing process on wafers W. Further, the developing units 31 and 32 have the identical structure. The heating and cooling sections 51 and 52, which likewise have the identical structure, are provided. Each of the heating and cooling sections 51 and 52 has a heating unit (PEB1, PEB2), which is called a post-exposure baking unit to perform a heating process on wafers W after exposure, a cooling unit (COL1, COL2) for adjusting the temperature of a wafer W to a predetermined temperature after the processing done in the heating unit (PEB1, PEB2), and a heating unit (POST1, POST2), which is called a postbaking unit to perform a heating process to dry out water on wafers W after a developing process.

At the DEV layer B1, wafers W are transferred among the first transfer stages TRS1, the second transfer stages TRS6, the developing unit 31, the individual process units of the shelf units U1 to U4 in the heating and cooling section 51, and the retaining unit 4 which serves as the second substrate retaining section for retreat by the main transfer mechanism A1. At the DEV layer B2, wafers W are transferred among the first transfer stages TRS2, TRS-F, the second transfer stages TRS7, the developing unit 32, the individual process units of the shelf units U1 to U4 in the heating and cooling section 52, and the retaining unit 4 which serves as the second substrate retaining section for retreat by the main transfer mechanism A2.

The third unit block (TCT layer) B3 is provided, as a liquid process unit, with the second antireflection-film forming unit 33 for performing the second antireflection-film forming process on wafers W. Further provided is the heating and cooling section 53, which basically has the same structure as the structure of the heating and cooling section 54 of the fourth unit block (COT layer) B4, except that the heating and cooling section 53 has a cooling unit (COL3) for adjusting the temperature of a wafer W to a predetermined temperature before the antireflection-film forming process, and a heating unit (CHP3) which performs a heating process on wafers W after the antireflection-film forming process.

At the TCT layer B3, wafers W are transferred among the first transfer stages TRS3, the second transfer stages TRS8, the second antireflection-film forming unit 33, the individual process units of the shelf units U1 to U4 in the heating and cooling section 53, and the retaining unit 4 by the main transfer mechanism A3.

The fifth unit block (BCT layer) B5 is provided, as a liquid process unit, with the first antireflection-film forming unit 35 for performing a process of forming the first antireflection film on wafers W. Further provided is the heating and cooling section 55, which has the same structure as the structure of the heating and cooling section 54 of the COT layer B4, except that the heating and cooling section 55 has a cooling unit (COL5) for adjusting the temperature of a wafer W to a predetermined temperature before the antireflection-film forming process, and a heating unit (CHP5) which performs a heating process on wafers W after the antireflection-film forming process, but does not have a periphery exposure apparatus (WEE).

At the BCT layer B5, wafers W are transferred among the first transfer stages TRS5, the second transfer stages TRS10, the first antireflection-film forming unit 35, the individual process units of the shelf units U1 to U4 in the heating and cooling section 55, and the retaining unit 4 by the main transfer mechanism A5.

As the heating units (CHP3 to CHP5, POST1, POST2, PEB1, PEB2), those which have a structure having a heating plate 503 and a cooling plate 504 which serves also as a transfer arm can be used, as shown in FIG. 2. Such a heating unit can execute transfer of wafers W to and from the main transfer mechanism using the cooling plate 504, and executes transfer of wafers W between the cooling plate 504 and the heating plate 503 as the cooling plate 504 is moved, so that the heating unit can execute both heating and cooling processes.

As the cooling units (COL1 to COL5), those which have a structure having a cooling plate of a water cooling type and cool wafers W placed on the cooling plate can be used.

FIG. 6 shows one example of the layout of those process units. The layout is given for the sake of convenience, and the process units to be laid out in the heating and cooling section are not limited to the heating units (CHP, PEB, POST), the cooling unit (COL), and the periphery exposure apparatus (WEE), and other process units may be provided. For instance, dehydrphobic process unit (ADH) which performs a gas treatment in the HMDS atmosphere can be provided in the unit blocks B3 to B5 for coating-film formation in order to improve the adhesion of the resist liquid and the wafer W. In an actual apparatus, the number of units to be provided is determined in consideration of the process times of the individual process units.

The interface block S3 has an interface-block transfer mechanism B for transferring wafers W to and from the shelf unit U6 of the process block S2 and the exposure apparatus S4. The interface-block transfer mechanism B, intervened between the process block S2 and the exposure apparatus S4, serves as transfer means for wafers W. In the embodiment, the interface-block transfer mechanism B is so constructed as to be movable forward and backward, liftable, and rotatable about the vertical axis to transfer wafers W to and from the second transfer stages TRS6 to TRS9 of the first to fourth unit blocks B1 to B4, as shown in FIG. 7.

The interface-block transfer mechanism B may be constructed in such a way as to transfer wafers W to and from the second transfer stages TRS6 to TRS10 of all the unit blocks B1 to B5.

A brief description will now be given of the structures of the main transfer mechanisms A1 to A5, the first and second sub-transfer mechanism D1 and D2, the interface-block transfer mechanism B, the liquid process unit, and the retaining unit 4.

Figure 5:
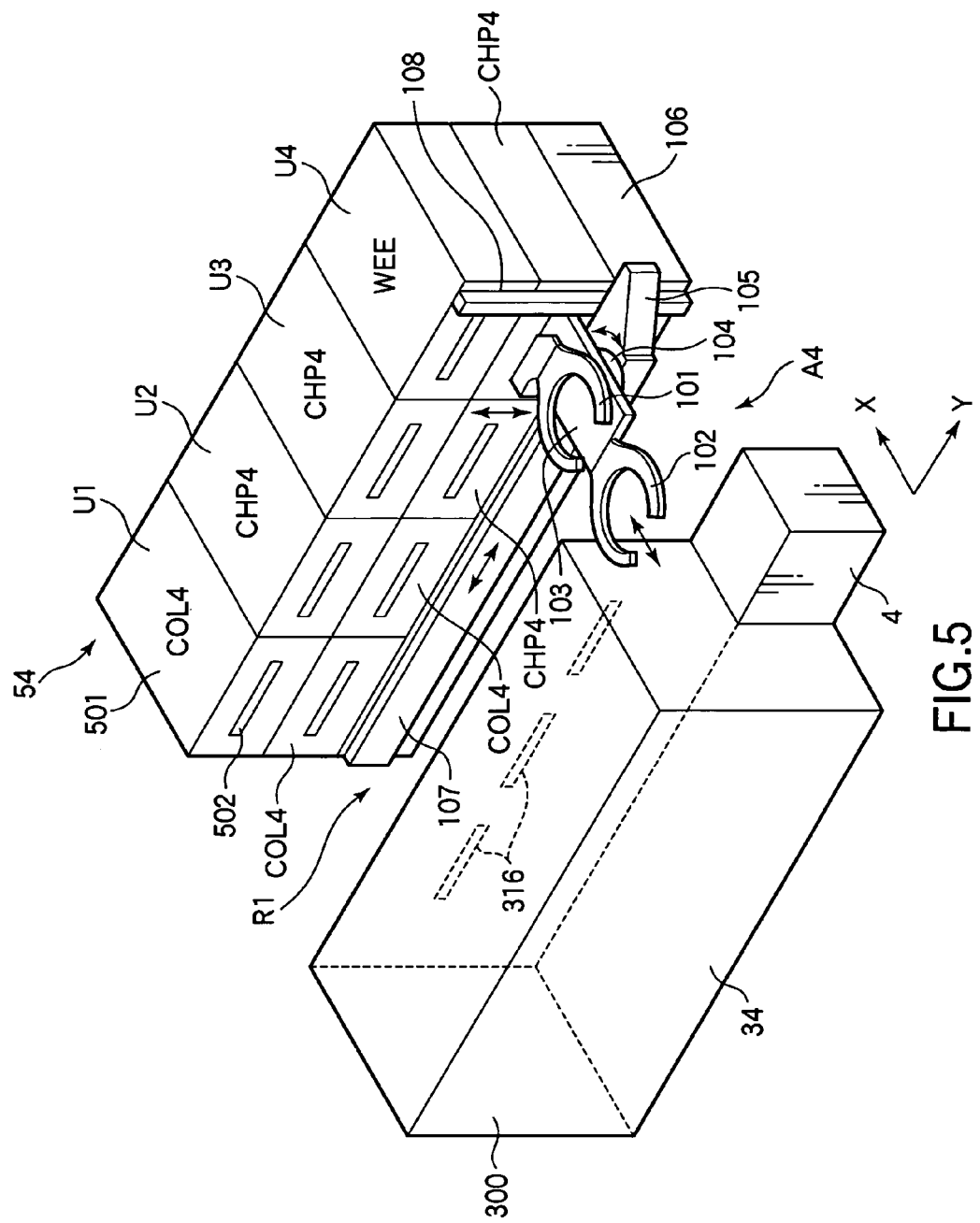
FIG. 5 is a perspective view showing a fourth unit block in the coating and developing apparatus in FIG. 2.

To begin with, as shown in FIG. 5, for example, each of the main transfer mechanisms A1 to A5 comprises two arms 101 and 102 for supporting the peripheral area of a wafer W at the back surface thereof, a base 103 which supports the arms 101 and 102 in a forward and backward movable manner, a rotating mechanism 104 which rotates the base 103 about the vertical axis, a moving mechanism 105 which moves the base 103 in the Y-axial direction and in the up-down direction of the transfer area, a Y-axial rail 107, provided on that side of a support 106 which faces the transfer area, along the Y-axial direction, and a lift rail 108 which guides the base 103 in the up-down direction. The support 106 supports the shelf units U1 to U4. The Y-axial rail 107 guides the base 103 in the Y-axial direction. This structure allows the arms 101 and 102 to be movable forward and backward, movable in the Y-axial direction, liftable, and rotatable about the vertical axis, so that wafers W can be transferred among the transfer stages TRS1 to TRS10 of the shelf units U5 and U6, and the process units of the shelf units U1 to U4, the developing units 31 to 35, and the retaining unit 4.

The driving of each of the main transfer mechanisms A1 to A5 is controlled by an unillustrated controller based on an instruction of the control device 6 to be discussed later. To prevent heat from being stored in the heating unit of the arm, the transfer order of wafers W can be controlled arbitrarily by a program.

The interface-block transfer mechanism B comprises a single arm 201 for supporting the center area of a wafer W at the back surface thereof, a base 202 which supports the arm 201 in a forward and backward movable manner, a lift platform 203 which lifts the base 202 up and down, a rotating mechanism 204 which rotates the base 202 about the vertical axis on the lift platform 203, and a lift rail 205 which guides the lift platform 203. This structure allows the arm 201 to be movable forward and backward, liftable, and rotatable about the vertical axis, so that wafers W can be transferred between the transfer stages TRS6 to TRS9 of the shelf unit U6, and the exposure apparatus S4.

The first and second sub-transfer mechanism D1 and D2 are constructed in the same way as the interface-block transfer mechanism B except that the transfer mechanism D1 and D2 do not rotate about the vertical axis.

The driving of the first and second sub-transfer mechanism D1 and D2 and the interface-block transfer mechanism B is controlled by the unillustrated controller based on an instruction of the control device 6.

Figure 10A:
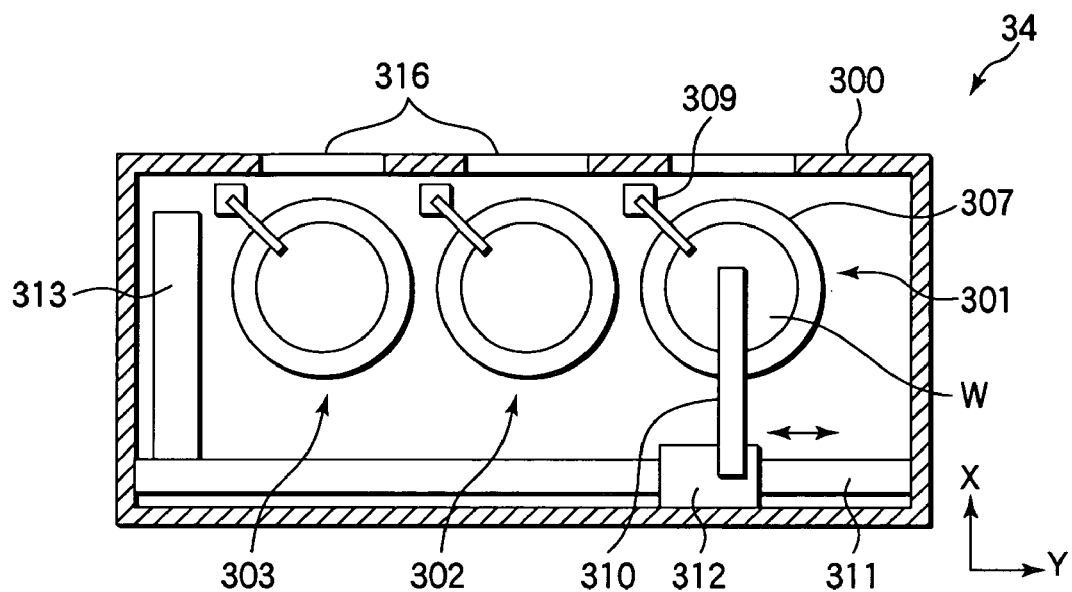
FIG. 10A is a plan view showing a coating unit mounted in the coating and developing apparatus in FIG. 2.
Figure 10B:
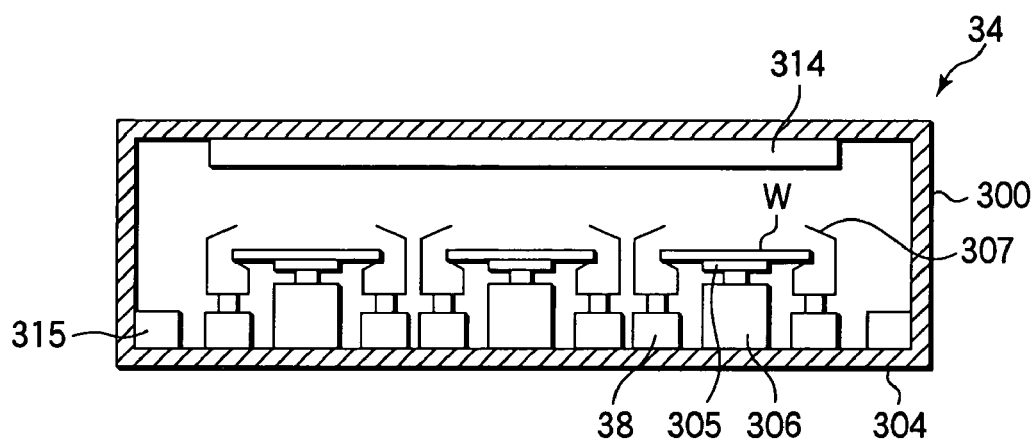
FIG. 10B is a longitudinal cross-section view of the coating unit.

Next, a brief description will be given of the coating unit 34 of the fourth unit block (COT layer) B4 referring to FIGS. 10A and 10B. The coating unit 34 has three coating sections 301, 302 and 303, and a common process container 300 which retain. the coating sections. The three coating sections 301, 302 and 303 are provided at a common base 304, laid out in the Y-axial direction in such a way as to face the transfer area R1. As the coating sections 301, 302 and 303 have the same structure, the coating section 301 will be discussed as a representative example. The coating section 301 has a spin chuck 305 which serves as a substrate holding section. The spin chuck 305 holds a wafer W horizontal by vacuum chuck, and is rotated about the vertical axis and is lifted by a drive section 306. The coating section 301 further has a cup 307 surrounding the side portions of the wafer W and the spin chuck 305, and a side rinse mechanism 309 which supplies a rinse liquid to the peripheral portion of a wafer W held by the spin chuck 305. The side rinse mechanism 309 is constructed so as to be liftable, and rotatable about the vertical axis.

The coating unit 34 has a common coating-liquid supply nozzle 310 for supplying a coating liquid to the three coating sections 301, 302 and 303. The coating-liquid supply nozzle 310 is constructed so as to be movable outward of the cup 307 of the coating section 303 from the outside of the cup 307 of the coating section 301 on one end side, along a guide rail 311, provided along the lengthwise direction (Y direction) of the process container 300, and liftable. This coating-liquid supply nozzle 310 supplies the resist liquid to approximately the center area of a wafer W held on the spin chuck 305 of each of the coating sections 301 to 303. A standby area 313 for the coating-liquid supply nozzle 310 is provided to the side of the coating section 303.

Further, the coating unit 34 has a filter unit 314 attached to the ceiling portion of the process container 300, and an exhaust section 315 provided at the bottom surface of the process container 300. As exhaust from the exhaust section 315 is carried out at a predetermined exaust amount and a clean gas with the temperature and humidity controlled is supplied from the filter unit 314 at a predetermined flow rate, the downflow of the clean gas is formed in the process container 300, so that the pressure therein becomes more positive than the pressure in the transfer area R1 of the main transfer mechanism A4. Three wafer inlet/outlet ports 316 are provided in that side of the process container 300 which faces the transfer area R1 at positions respectively corresponding to the coating sections 301, 302 and 303. Each inlet/outlet port 316 is provided with an opening/closing shutter.

In the coating unit 34, a wafer W is transferred into the process container 300 via one of the wafer inlet/outlet ports 316, and is transferred to the spin chuck 305 of a predetermined one of the coating sections 301, 302 and 303 by the main transfer mechanism A4. Then, the resist liquid is supplied to the center portion of the wafer W from the coating-liquid supply nozzle 310, and the spin chuck 305 is rotated to spread the resist liquid in the radial direction of the wafer W by the centrifugal force. As a result, a film of the resist liquid is formed on the top surface of the wafer W. The wafer having the film of the resist liquid formed on its top surface is carried out of the coating unit 34 by the main transfer mechanism A4.

Because the three coating sections 301 to 303 are provided inside the common process container 300 and the resist liquid is supplied by the common coating-liquid supply nozzle 310 in the coating unit 34, the total number of members and the area of occupation can be reduced, as compared with a case where the process container 300 and the coating-liquid supply nozzle 310 are provided for each of the coating sections 301 to 303.

As the three coating sections 301 to 303 are provided at the common base 304, height adjustment of the spin chuck 305 and the arms 101 and 102 of the main transfer mechanism A4, if executed, should be carried out for one of the coating and developing sections 301 to 303. As the coating and developing apparatus is constructed in such a way that the resist liquid (coating liquid) is supplied to the individual coating sections 301 to 303, height adjustment of each spin chuck 305 and the coating-liquid supply nozzle 310 should be carried out for one of the coating sections 301 to 303. This reduces the work needed for those height adjustments and shortens the adjustment time.

Further, the provision of the three coating sections 301 to 303 in the common process container 300 can commonize the supply of air which form the downflow and the discharge of the air, thereby reducing the total number of members and the area of occupation, and is thus effective.

Next, a description will be given of the developing units 31 and 32 of the first and second unit blocks (DEV layers) B1 and B2. The developing units 31 and 32 are constructed in approximately the same way as the coating unit 34, except that an elongated developing-liquid supply nozzle in which a discharge area is formed in the lengthwise direction is provided instead of the coating-liquid supply nozzle 310 and the developing units 31 and 32 have a cleaning-liquid nozzle. The discharge area of the developing-liquid supply nozzle has a length equivalent to the diameter of a wafer W. The cleaning-liquid nozzle, like the coating-liquid supply nozzle 310, is constructed so as to be movable along the guide rail 311 and liftable by a moving mechanism, thereby supplying the cleaning liquid to a wafer W held on the spin chuck 305.

In the developing unit 31, 32, a wafer W is transferred into the process container via the inlet/outlet portion and is transferred to the spin chuck of a predetermined coating section by the main transfer mechanism A1, A2, as per the coating unit 34. The developing-liquid supply nozzle is positioned to the center of the wafer W to supply the developing liquid there and the wafer is rotated, for example, by a half turn by the spin chuck, thereby supplying the developing liquid to the entire surface of the wafer W. After a predetermined time elapses, the cleaning liquid is supplied to the wafer W from the cleaning-liquid nozzle to rinse the developing liquid off the surface of the wafer W, then the wafer W is rotated and dried, which completes the developing process.

The first antireflection-film forming unit 35 of the fifth unit block (BCT layer) B5 is for applying a chemical liquid for an antireflection film to a wafer W prior to application of the resist liquid, and the second antireflection-film forming unit 33 of the third unit block (TCT layer) B3 is for applying a chemical liquid for an antireflection film to a wafer W after application of the resist liquid. Those units 35 and 33 are constructed in the same way as the coating unit 34, except that they have a antireflection-film chemical liquid supply nozzle having the same structure as the coating-liquid supply nozzle 310, in place of the supply nozzle 310.

Figure 11:
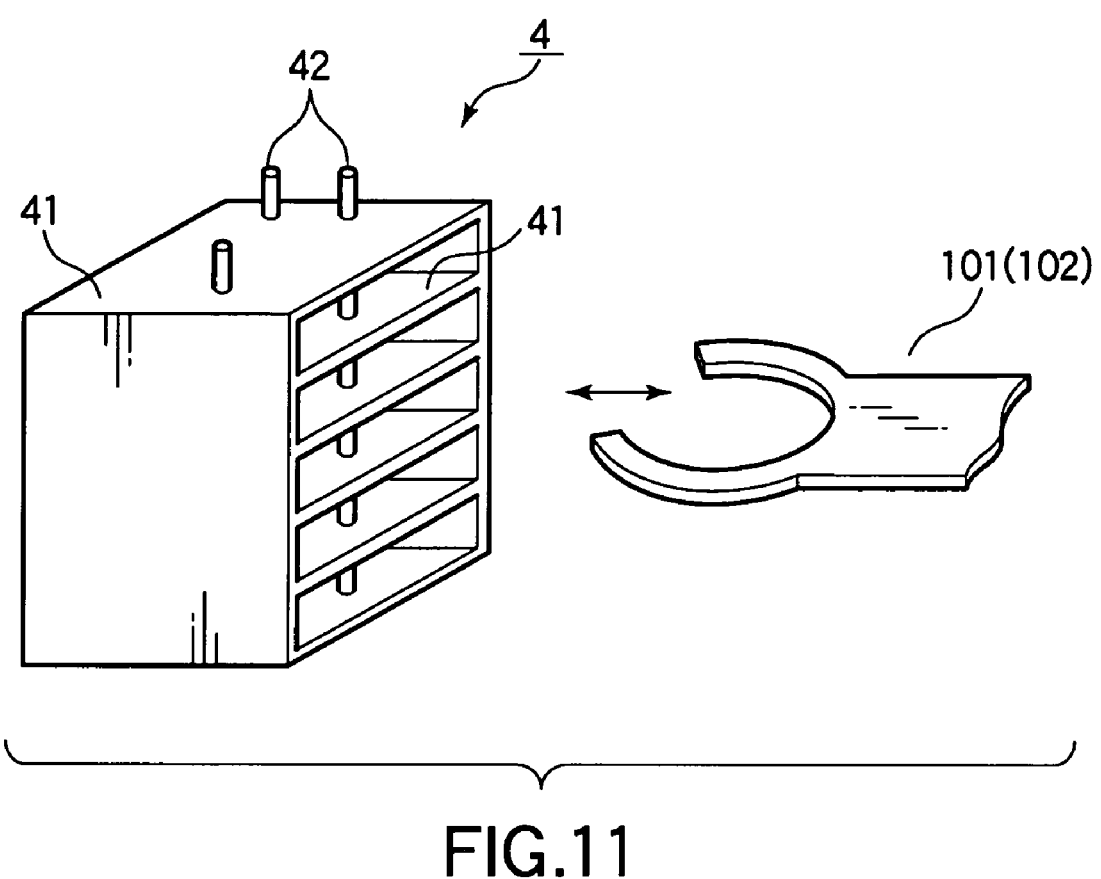
FIG. 11 is a perspective view showing a retaining unit mounted in the coating and developing apparatus in FIG. 2.

A description will now be given of the-retaining unit 4 referring to FIG. 11. As shown in FIG. 11, the retaining unit 4 has a plurality of stages 41 on which a plurality of wafers W whose quantity corresponds to the number of retainable wafers W in that unit block where the retaining unit 4 is provided are placed and retained. In this embodiment, there are six stages 41 provided to be able to retain six wafers W. Projections 42 for supporting the back surface of a wafer W are provided on each susceptor stage 41. The projections 42 are provided at such positions that do not interfere with the arms of the main transfer mechanism, so that wafers W can be transferred to and from the main transfer mechanism.

Next, a description of the flow of a wafer in the resist-pattern forming apparatus, which is structured as described above, will now be given of a case where the antireflection films are formed on both of the above and below of the resist film.

First, the carrier 20 is transferred to the carrier block 21 from the exterior. In this state, one of the wafers W in the carrier 20 is taken out by the carrier-block transfer mechanism C. The wafer W is transferred to the first transfer stage TRS-F of the shelf unit U5 from the carrier-block transfer mechanism C. Next, the wafer W is transferred to the first transfer stage TRS5 of the shelf unit U5 by the first sub-transfer mechanism D1, and further received by the main transfer mechanism A5 of the fifth unit block (BTC layer) B5. Then, at the BTC layer B5, the wafer W is sequentially transferred to the cooling unit (COL5), the first antireflection-film forming unit 35, the heating unit (CHP5), and the transfer stage TRS10 of the shelf unit U6 in the named order by the main transfer mechanism A5, and the first antireflection film is formed.

Subsequently, the wafer W of the second transfer stage TRS10 is transferred to the second transfer stage TRS9 of the shelf unit U6 by the second sub-transfer mechanism D2. Next, the wafer W of the second transfer stage TRS9 is received by the main transfer mechanism A4 of the fourth unit block (COT layer). Then, at the COT layer B4, the wafer W is sequentially transferred to the cooling unit COL4, the coating unit 34, the heating unit CHP4, and the first transfer stage TRS4 of the shelf unit U5 in the named order by the main transfer mechanism A4, and the resist film is formed on the upper layer of the first antireflection film.

Thereafter, the wafer W of the first transfer stage TRS4 is transferred to the first transfer stage TRS3 by the first sub-transfer mechanism D1. Next, the wafer W of the first transfer stage TRS3 is received by the main transfer mechanism A3 of the third unit block (TCT layer). Then, at the TCT layer B3, the wafer W is sequentially transferred to the cooling unit (COL3), the second antireflection-film forming unit 33, the heating unit CHP3, the peripheral edge exposure apparatus (WEE), and the second transfer stage TRS8 of the shelf unit 6 in the named order by the main transfer mechanism A3, and the second antireflection film is formed on the upper layer of the resist film.

Next, the wafer W of the second transfer stage TRS8 is received by the interface-block transfer mechanism B, and is transferred to the exposure apparatus S4. The wafer W, transferred to the exposure apparatus S4, undergoes a predetermined exposure at there.

The wafer W after the exposure is transferred to the second transfer stage TRS6 or TR7 of the shelf unit U6 by the interface-block transfer mechanism B. The wafer W of the transfer stage TRS6 or TRS 7 is received by the main transfer mechanism A1 or A2 of the first or second unit block (DEV layer) B1 or B2. At the DEV layer B1 or B2, first, the wafer W is transferred to the heating unit (PEB1 or PEB2), the cooling unit (COL1 or COL2), the developing unit 31 or 32, and the heating unit (POST1 or POST2) in the named order, and a predetermined development process is performed. The wafer W applied the development herewith is transferred to the first transfer stage TRS1 or TRS2 of the shelf unit U5, and is returned to the initial carrier 20, mounted on the carrier block S1, by the carrier-block transfer mechanism C.

Figure 12:
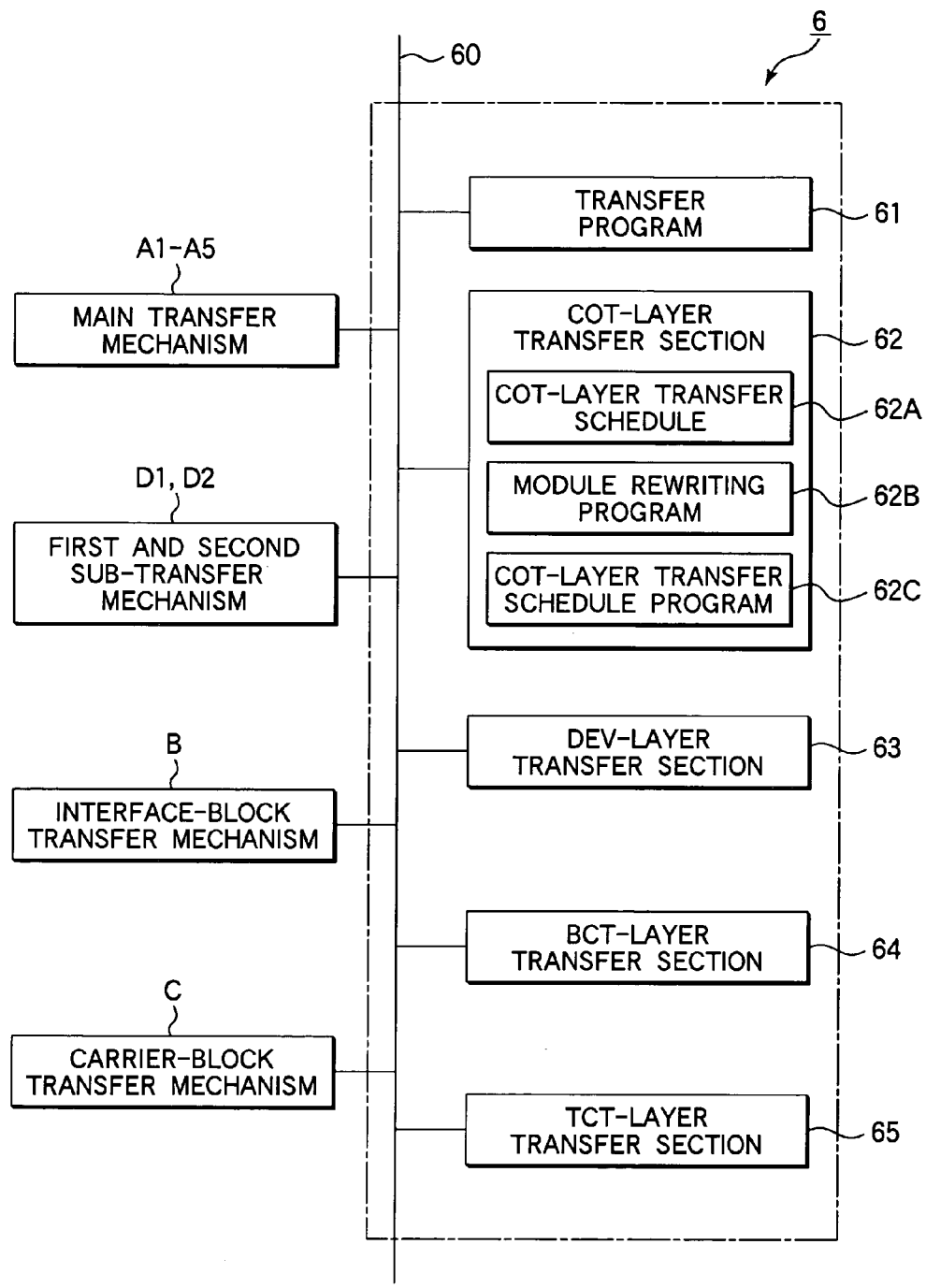
FIG. 12 is a structural diagram showing an example of a control device in the coating and developing apparatus in FIG. 2.

In the resist-pattern forming apparatus which operates as explained above, the management of the recipe of each process unit, and the driving for the main transfer mechanisms A1 to A5, the carrier-block transfer mechanism C, the first and second sub-transfer mechanisms D1 and D2, and the interface-block transfer mechanism B are controlled by the control device 6. FIG. 12 illustrates the structure of the control device 6. In practice, the control device 6 comprises a CPU (Central Processing Unit), a program, a memory, and so on. Because the present invention is characterized in the transfer of the wafer W, however, those of the components which are associated with the feature are illustrated as blocks in the following description.

Referring to the diagram, a bus 60 is connected with the controller (not illustrated) of a transfer program 61, a COT-layer transfer section 62, a DEV-layer transfer section 63, a BCT-layer transfer section 64, a TCT-layer transfer section 65, and controller (not shown) of the main transfer mechanisms A1 to A5 of each layer, the first and second sub-transfer mechanisms D1 and D2, the interface-block transfer mechanism B, and the carrier-block transfer mechanism C.

The transfer program 61 controls the transfers of the main transfer mechanisms A1 to A5 of each layer, the first and second sub-transfer mechanisms D1 and D2, the carrier-block transfer mechanism C, and the interface-block transfer mechanism B.

The COT-layer transfer section 62 includes a COT-layer transfer schedule 62A, a module rewriting program 62B, and a COT-layer transfer schedule program 62C. The COT-layer transfer schedule 62A defines at what timing and to which module the wafer W is to be transferred in the COT layer B4. For instance, as illustrated in FIG. 13, the COT-layer transfer schedule 62A is so created as to assign the sequential order for the wafers W, and to time-sequentially list transfer-cycle data which assigns the transfer cycle (phase) with the sequential order for the wafers W associated with the individual modules. In this embodiment, it is illustrated that the first wafer W1 is transferred to the cooling unit (COL4) at the phase 1, the first wafer W1 is transferred to the coating unit 34 (COT) at the phase 2, and the second wafer W2 is transferred to the cooling unit (COL4). In this embodiment, each of the cooling unit (COL4), coating unit 34 (coating sections 301 to 303), and the heating unit (CHP4) are collectively written as one module, but the transfer order for the wafers W is written for the individual modules in practice.

As the main transfer mechanisms A1 to A5 have two or more arms, the main transfer mechanism A4 of the COT layer B4 takes out the wafer W from one module by one arm and receives the wafer W for the next module by the other arm, and transfers the first wafer W on the one arm to the next module. One transfer cycle (phase) is carried out as the wafer W placed on each module as explained is transferred to the next module succeeding by one, after which the transfer stage goes to the next one, so that the individual transfer cycles are carried out one after another. Accordingly, the wafer W is sequentially transferred to the cooling unit (COL4), the coating unit 34, the heating unit (CHP4), and the transfer stage TRS4 in the named order to undergo a predetermined process. In normal mode, therefore, the transfer stage TRS4 becomes the last module of the COT layer B4.

In the embodiment, the module rewriting program 62B rewrites, as illustrated in FIG. 14, the last module of the COT-layer transfer schedule 62A to the retaining unit 4 when some kind of abnormality occurs in the interface-block transfer mechanism B. The COT-layer transfer schedule program 62C controls the main transfer mechanism A4 in accordance with the transfer schedules of FIGS. 13 and 14, and transfers the wafer W to each module in the COT layer B4.

The DEV-layer transfer section 63, like the COT-layer transfer section 62, includes a DEV-layer transfer schedule, a module rewriting program, and a DEV-layer transfer schedule program. The transfer schedule is so created as to sequentially transfer the wafer W to the heating unit (PEB1 (PEB2)), the developing unit 31 (32), the cooling unit (COL1 (COL 2)), the heating unit (POST1 (POST2)), and the transfer stage TRS1 (TRS2) in the named order. The module rewriting program, like the COT-layer transfer section 62, rewrites the last module to the retaining unit 4 from the transfer stage TRS1 when some kind of abnormality occurs in the carrier-block transfer mechanism C.

The BCT-layer transfer section 64, like the COT-layer transfer section 62, includes a BCT-layer transfer schedule, a module rewriting program, and a BCT-layer transfer schedule program. The transfer schedule is so created as to sequentially transfer the wafer W to the cooling unit (COL5), the first antireflection-film forming unit 35, the heating unit (CHP5), and the transfer stage TRS10 in the named order. The module rewriting program, like the COT-layer transfer section 62, rewrites the last module to the retaining unit 4 from the transfer stage TRS10 when some kind of abnormality occurs in the interface-block transfer mechanism B.

The TCT-layer transfer section 65 includes, similar to the COT-layer transfer section 62, a TCT-layer transfer schedule, a module rewriting program, and a TCT-layer transfer schedule program. The transfer schedule is so created as to sequentially transfer the wafer W to the cooling unit (COL3), the second antireflection-film forming unit 33, the heating unit (CHP3), the peripheral edge exposure apparatus (WEE), and the transfer unit TRS8 in the named order. The module rewriting program, like the COT-layer transfer section 62, rewrites the last module to the retaining unit 4 from the transfer unit TRS8 when some kind of abnormality occurs in the interface-block transfer mechanism B.

The case where some kind of abnormality occurs in the interface-block transfer mechanism B or the carrier-block C is a case where the transfer of the wafer W cannot be carried out between the predetermined stages TRS and the main transfer mechanisms A1 to A5 at the timing set by the transfer schedule because of the occurrence of some abnormality, such as a failure in the interface-block transfer mechanism B or the carrier-block C, collision against the transfer stage TRS, or the delayed delivery from the exposure apparatus S4.

The control device 6 stores a control program which is required for the control of the process of the apparatus as a whole, including the above operation, and a program for having each structure portion to perform a process in accordance with a process condition, i.e., a recipe. The recipe may be stored in a hard disk, a semiconductor memory or the like, and set to a predetermined position in the form of a portable storage medium like a CDROM or DVD storing the recipe. The recipe may be appropriately transmitted from another apparatus through a dedicated line.

Figure 15:
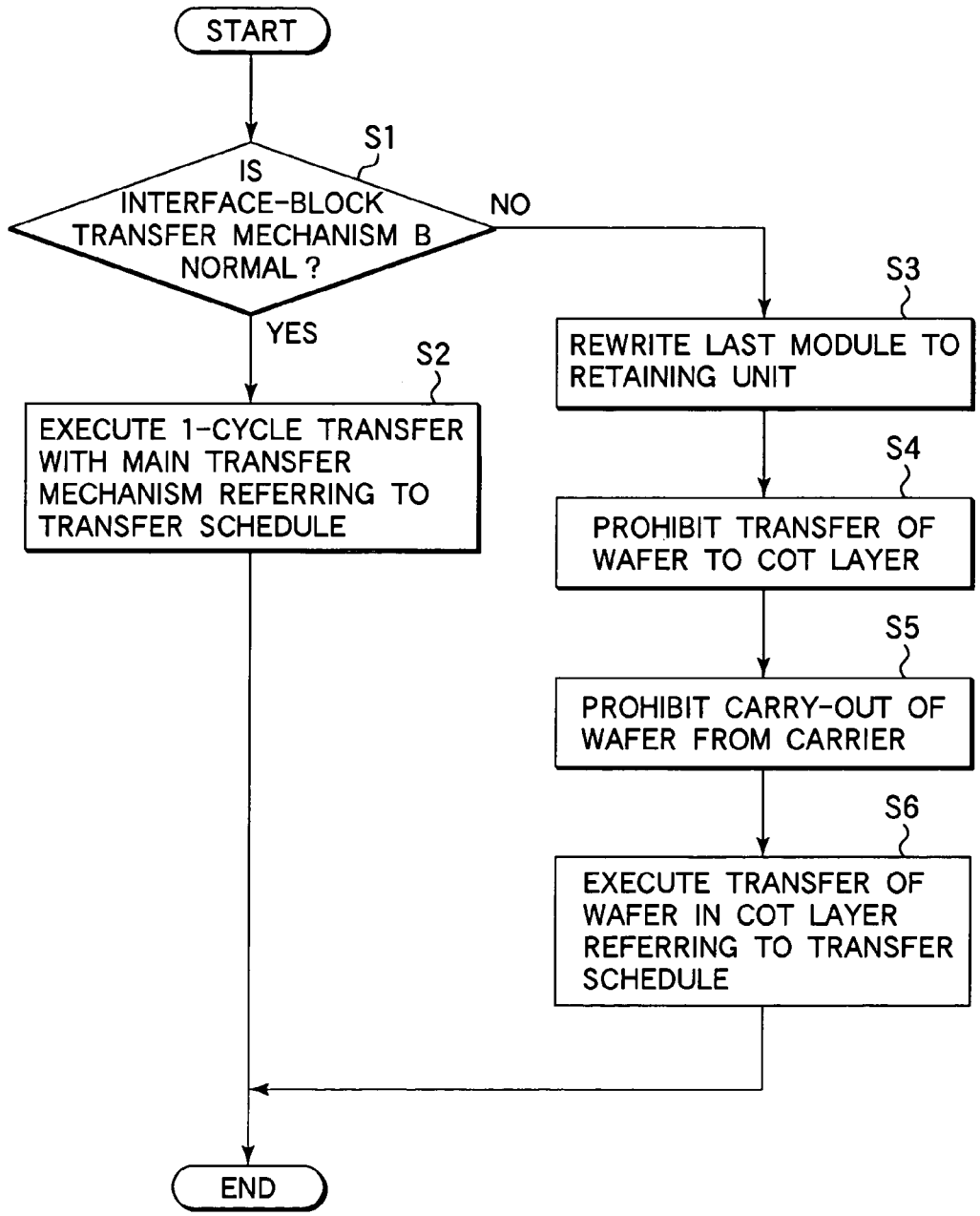
FIG. 15 is a flowchart illustrating a process flow in a COT layer in the coating and developing apparatus in FIG. 2.

Next, the function of the embodiment will be explained. In the embodiment, the transfer of the wafer W is carried out by each of the main mechanisms A1 to A5 at each associated unit block of the DEV layers B1 and B2, TCT layer B3, COT layer B4, and BCT layer B5, in accordance with each transfer schedule. As the control of the transfer of the wafer W is similarly carried out at each unit block of the coating-film-forming unit blocks (TCT layer B3, COT layer B4, and BCT layer B5) in this embodiment, the explanation will be given taking the COT layer B4 as an example referring to FIG. 15.

In this case, first, the control device 6 checks whether or not the interface-block transfer mechanism is normal (step S1). If normal, the flows goes to step S2 where the main transfer mechanism A4 carries out one cycle of the transfer while referring to the transfer schedule. In contrast, if some abnormality occurs in the interface-block transfer mechanism B, the flows goes to step S3 where the last module of the transfer schedule is rewritten to the retaining unit 4 from the stage TRS4. At step S4, the transfer of the wafer W from the BCT layer B5 to the COT layer B4 is prohibited, and the delivery of the wafer W from the carrier 20 is prohibited at step S5. Next, at step S6, the transfer for the wafer W of the COT layer B4 is performed referring to the rewritten transfer schedule.

At the TCT layer B3, like the COT layer B4, when some abnormality occurs in the interface-block transfer mechanism B, the control on the transfer of the wafer W is carried out. That is, whether or not the interface-block transfer mechanism B is normal is determined at first, and, if it is normal, the main transfer mechanism A3 performs one cycle of the transfer while referring to the transfer schedule. In contrast, if some abnormality occurs in the interface-block transfer mechanism B, the last module of the transfer schedule is rewritten to the retaining unit 4 from the transfer stage TRS8, the transfer of the wafer W to the TCT layer B3 is prohibited and the carry-out of the wafer W from the carrier block S1 is prohibited, and the transfer of the wafer W of the TCT layer B3 is performed referring to the rewritten transfer schedule.

Further, at the BCT layer B5, like the COT layer B3, the control on the transfer of the wafer W is carried out when some abnormality occurs in the interface-block transfer mechanism B. When the interface-block transfer mechanism B is normal, the main transfer mechanism A5 performs one cycle of the transfer while referring to the transfer schedule. In contrast, if some abnormality occurs in the interface-block transfer mechanism B, the last module of the transfer schedule is rewritten to the retaining unit 4 from the transfer stage TRS10, the transfer of the wafer W to the BCT layer B5 from the carrier block S1 is prohibited and the carry-out of the wafer W from the carrier 20 is prohibited, and the transfer of the wafer W of the BCT layer B5 is performed referring to the rewritten transfer schedule.

Figure 16:
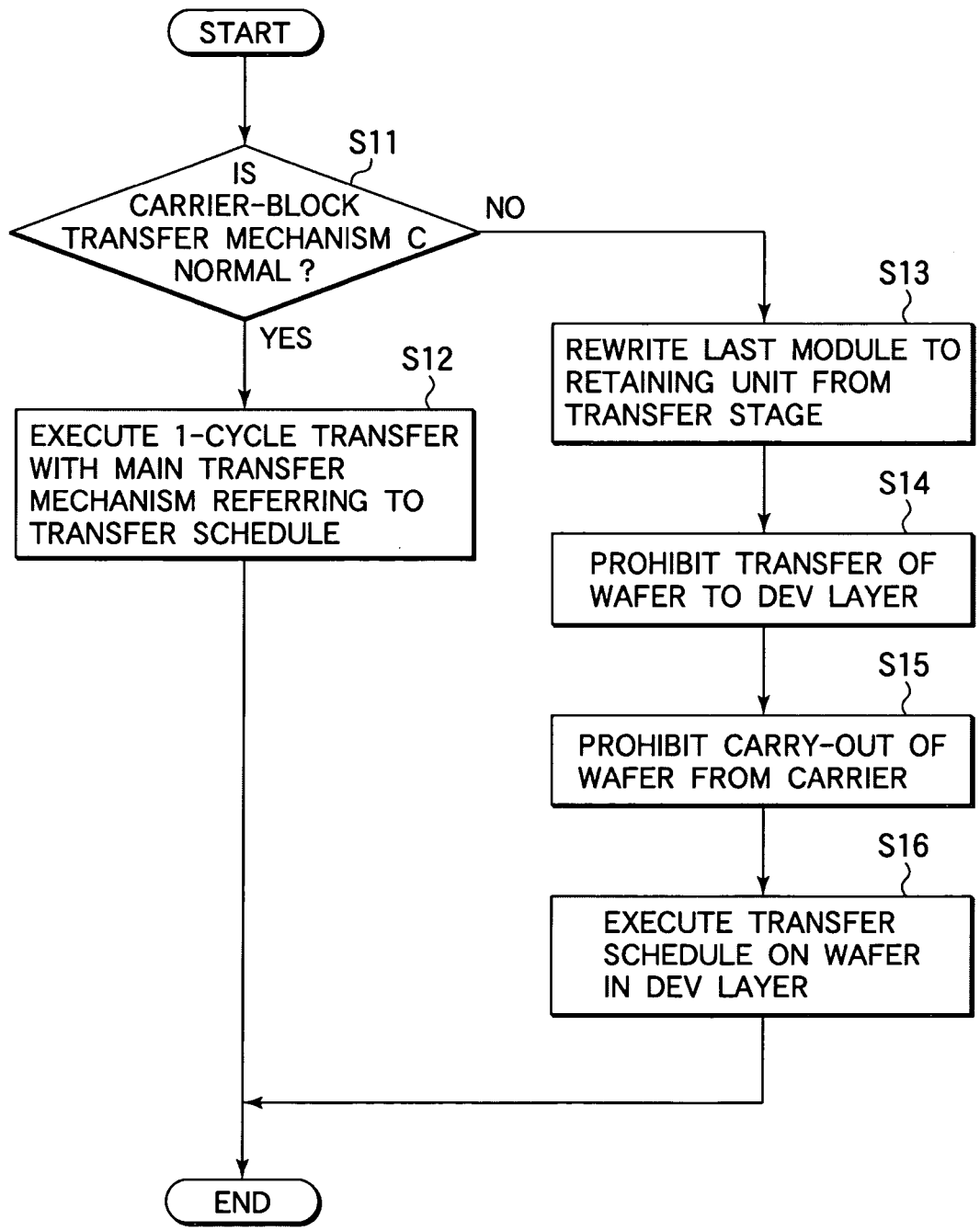
FIG. 16 is a flowchart illustrating a process flow in a DEV layer in the coating and developing apparatus in FIG. 2.

At the DEV layer B1, as illustrated in FIG. 16, it is determined whether or not the carrier-block transfer mechanism C is normal (step S11). When the carrier-block transfer mechanism C is normal, the control on the transfer of the wafer W is carried out and the main transfer mechanism A1 performs one cycle of the transfer while referring to the transfer schedule, as per the COT layer B4 (step S12). In contrast, if any trouble happens to the carrier-block transfer mechanism C, the last module of the transfer schedule is rewritten as the retaining unit 4 from the transfer stage TRS1 (step S13), the transfer of the wafer W to the DEV layer B1 from the interface block S3 is prohibited (step S14) and the carry-out of the wafer W from the carrier 20 is prohibited (step S15), and the transfer of the wafer W of the DEV layer B1 is performed referring to the rewritten transfer schedule (step S16). Quite the same control as done for the DEV layer B1 is performed on the transfer of the wafer W at the DEV layer B2.

In the resist-pattern forming apparatus as explained, the unit block for each coating-film formation is provided at a different area of the unit block for the development, and each of them are provided with the dedicated main transfer mechanism, whereby the load for the main transfer mechanism can be reduced. Accordingly, the transfer efficiency is improved, thus enhancing the throughput as a consequence.

When some kind of abnormality occurs in the interface-block transfer mechanism B, at each of the unit block of the TCT layer B3, COT layer B4, and BCT layer B5 for the coating-film formation, the last module of the transfer schedule is rewritten to the retaining unit 4, the transfer of the wafer W to each unit block is prohibited, and the wafer W in each block unit is transferred in accordance with the rewritten transfer schedule. Accordingly, even if some kind of abnormality occurs in the interface-block transfer mechanism B, the normal process is performed on the wafer W present in each unit block, and then the wafer W is retreated to the retaining unit 4 in each unit block, the normal process is performed, all the way, on the wafer W in each unit block. At each module in each unit block, therefore, as a preset predetermined process can be performed, the deterioration of the quality of the resist film can be prevented, the wafer W in each unit block is not wasted, and reduction in yield can be suppressed.

Suppose that the wafer W is not retreated to the retaining unit 4 at each unit block when some abnormality occurs in the interface-block transfer mechanism B with the COT layer B4 taken as an example. In this case, the interface-block transfer mechanism B cannot receive the wafer W of the transfer stage TRS8 or the last module of the TCT layer B3, so that there is no place for placing a wafer W following that the former wafer W when the following wafer W is to be mounted on the transfer stage TRS 8 at the TCT layer B3. Accordingly, the main transfer mechanism A3 keeps holding the subsequent wafer W, and the wafer transfer by the main transfer mechanism A3 stops in this state.

When the main transfer mechanism A3 halts, the wafer W is also kept mounted on the transfer stage TRS3 for transferring the wafer W from the COT layer B4 to the TCT layer B3, whereby a new wafer W cannot be transferred from the COT layer B4 to the TCT layer B3 by the first sub-transfer mechanism D1. Accordingly, at the COT layer B4, the wafer W on the transfer stage TRS4, which is the last module, cannot be received by the first sub-transfer mechanism D1, and thus there is no place for placing the following wafer W when the following wafer W is to be mounted. Therefore, the main transfer mechanism A4 keeps holding the subsequent wafer W which cannot be placed anywhere, so that the wafer transfer by the main transfer mechanism A4 stops in this state.

Accordingly, at each module in the COT layer B4, the wafer W is not taken out by the main transfer mechanism A4 at a predetermined timing and is kept being placed in the module, whereby the quality of the resist film is deteriorated, and the yield of the wafer W is dropped.

When any trouble happens to the carrier-block transfer mechanism C, a normal process is performed on the wafer W in the DEV layer B1 (B2), and then the wafer W is retreated to the retaining unit 4A (4B). Therefore, the processes which are executed at the DEV layer B1 (B2) can be executed to the end. Therefore, the deterioration of the quality of the resist film because of the wafer W left in each module of the DEV layer B1 (B2) can be prevented, and reduction in yield can be suppressed.

Suppose that the wafer W is not retreated to the retaining unit 4 at the unit block for the development when some kind of abnormality occurs in the carrier-block transfer mechanism C. In this case, the carrier-block transfer mechanism C cannot receive the wafer W in the transfer stage TRS1 or TRS2, which is the last module in the DEV layer B1 or B2, and the wafer W is kept held at each module in the DEV layer B1 or B2, thereby deteriorating the quality of the resist film.

As explained above, according to the present invention, when some abnormality occurs in the interface-block transfer mechanism B or the carrier-block transfer mechanism C, normal processes are performed on the wafers W, present in the unit blocks B1 to B5, in the unit blocks B1 to B5, as the wafer transfer by the main transfer mechanism is so controlled as to transfer the wafer W to the retaining unit 4 for the retreat in each unit block, and the wafer transfers by the first sub-transfer mechanism D1 and the interface-block transfer mechanism B are so controlled as not to transfer the wafers W to the unit blocks B1 to B5. This can suppress the deterioration of the quality of the resist film, which is formed on the wafer W, and reduction in yield as explained above.

As described above, the transfer control of each of the main transfer mechanisms A1 to A5 can be carried out by only rewriting the last module, which makes the transfer program simpler.

The above-described embodiment is intended to clarify the technical contents of the present invention, and the present invention should not be interpreted as restrictive only to the specific example, but it can be realized with various changes within the spirit of the present invention and the scope as set forth in the appended claims.

For instance, in the present invention, the number of the stacked layers of each unit block, the sequential order of the stacked layers are not limited to the above-described example, the unit blocks for the development may be one layer, and the unit blocks for the coating-film formation may be arranged as the BCT layer, the COT layer, the TCT layer, in order, from bottom to top. The unit blocks for the coating-film formation may be arranged downward, and the unit blocks for the development may be arranged above them.

The unit block to be used may be selected from the DEV layers B1, B2, the TCT layer B3, the COT layer B4, and the BCT layer B5. In this case, either one of the DEV layers B1 and B2 may be selectable. For instance, not all of the TCT layer B3, COT layer B4, BCT layer B5 are needed; the TCT layer B3 is not needed when the antireflection film is formed only on the bottom portion of the resist film, so that the BCT layer B5 and the COT layer B4 should be selected from among the TCT layer B3, COT layer B4, and BCT layer B5 and used. Needless to say, the TCT layer B3 may not be provided in such a case.

In that case, the transfer is carried out through the path from the carrier 20 to the carrier block transfer mechanism C, the first transfer stage TRS-F of the shelf unit U5, the first sub-transfer mechanism D1, the first transfer stage TRS5, the main transfer mechanism A5 of the BCT layer B5, the cooling unit (COL5), the first antireflection-film forming unit 35, the heating unit (CHP5), the second transfer stage TRS10 of the shelf unit U6, the second sub-transfer mechanism D2, the second transfer stage TRS9, the main transfer mechanism A4 of the COT layer B4, the cooling unit (COL4), the coating unit 34, the heating unit (CHP4), the second transfer stage TRS9 of the shelf unit U6, the interface-block transfer mechanism B, the exposure apparatus S4, the interface-block transfer mechanism B, the transfer stage TRS6 (TRS7) of the shelf unit U6, and the DEV layer B1 (B2).

Also in this case, regarding the BCT layer B5 and the COT layer B4, the last modules of the transfer schedules are rewritten as the retaining units 4, and the wafers W in the BCT layer B5 and the COT layer B4 are transferred in accordance with the rewritten transfer schedules, when some abnormality occurs in the interface-block transfer mechanism B.

In forming the antireflection layer on the upper portion of the resist film, the BCT layer B5 is not needed, and thus the TCT layer B3 and the COT layer B4 can be selected and used from the TCT layer B3, the COT layer B4, and the BCT layer B5. Needless to say, the BCT layer B5 may not be provided. In this case, the transfer is carried out through the path of the carrier 20, the carrier block transfer mechanism C, the first transfer stage TRS-F of the shelf unit U5, the first sub-transfer mechanism D1, the first stage TRS4, the main transfer mechanism A4 of the COT layer B4 in the named order. The transfer path of the wafer W in the COT layer B4, and the transfer path of the wafer W after the COT layer B4 is the same as those in the above-described examples.

Also in this case, regarding to the COT layer B4 and the TCT layer B3, the last modules of the transfer schedules are rewritten as the retaining units 4, and the wafers W in the COT layer B4 and the TCT layer B3 are transferred in accordance with the rewritten transfer schedules, when some abnormality occurs in the interface-block transfer mechanism B.

Although the foregoing description of the embodiment has been given of the case where some abnormality occurs in the interface-block transfer mechanism B as the transfer means intervening between the process block S2 and the exposure apparatus S4, such transfer means, however, includes the second sub-transfer mechanism D2, and, when some abnormality occurs in the second sub-transfer mechanism D2, the last module of the transfer schedule may be rewritten to the retaining unit 4 and the wafers W in the TCT layer B3, the COT layer B4, and the BCT layer B5 may be transferred in accordance with the rewritten transfer schedule at the TCT layer B3, the COT layer B4, and the BCT layer B5, as in the case where some abnormality occurs in the interface-block transfer mechanism B.

At the TCT layer B3, the COT layer B4, and the BCT layer B5, when some kind of abnormality occurs in the first sub-transfer mechanism D1, the last module of the transfer schedule may be rewritten to the retaining unit 4 and the wafers W in the TCT layer B3, the COT layer B4, and the BCT layer B5 may be transferred in accordance with the rewritten transfer schedule as in the case where some abnormality occurs in the interface-block transfer mechanism B.

With such control, even if some kind of abnormality occurs in the first and second sub-transfer mechanisms D1, D2, regarding to the wafers W in the unit blocks B3 to B5, the main transfer mechanisms A3 to A5 can carry out the normal transfers. Therefore, the normal processes can be performed to the end, the deterioration of the quality of the resist film can be suppressed, and reduction in yield can be also suppressed. The transfer program becomes as simple as explained above.

Also at the DEV layers B1, B2, when some abnormality occurs in the interface-block transfer mechanism B, the last module of the transfer schedule may be rewritten to the retaining unit 4 and the wafers W in the DEV layers B1, B2 may be transferred in accordance with the rewritten transfer schedule as in the case where some abnormality occurs in the carrier-block transfer mechanism C. With this control, when some abnormality occurs in the interface-block transfer mechanism B, there is no transfer of the wafer W to the carrier block S1 from the DEV layers B1 and B2, making it possible to halt the carrier-block transfer mechanism C and facilitating the writing of the transfer program.

Also at the TCT layer B3, the COT layer B4, and the BCT layer B5, when some kind of abnormality occurs in the carrier-block transfer mechanism C, the last module of the transfer schedule may be rewritten to the retaining unit 4 and the wafers W in the TCT layer B3, the COT layer B4, and the BCT layer B5 may be transferred in accordance with the rewritten transfer schedule. With the control, when some abnormality occurs in the carrier-block transfer mechanism C, as there is no transfer of the wafer W to the carrier block S3 from the TCT layer B3, the COT layer B4, and the BCT layer B5, the interface-block transfer mechanism B can be halted and the writing of the transfer program becomes easier.

Although the retaining unit 4, as the first substrate storing section or the second substrate storing section, is provided adjacent to the coating unit, the developing unit or the like, which is not restrictive, and the retaining unit 4 may be provided in either one or both of the shelf units U5 and U6 in each of the unit blocks B1 to B5. In this case, each of the shelf units U5 and U6 may be provided with multiple transfer stages, some of which can be used as the substrate retaining section. With the modification, the last module of each of the unit blocks B1 to B5 is the transfer stage of either the shelf unit U5 or U6, so that when the wafer W is transferred in accordance with the rewritten transfer schedule, the wafer W should be transferred to the substrate retaining section of the shelf unit U5 or U6. Accordingly, the transfer paths of the main transfer mechanisms A1 to A5 hardly change, making the writing of the transfer program easier. As it is unnecessary to provide the retaining unit separately, the unit block can be downsized and the number of the parts that constitute the unit block can be reduced.

In the above-described embodiment, the retaining unit 4 are provided as the substrate retaining unit in each of the unit blocks B1 to B5, which is not restrictive. For instance, the retaining unit 4 may be provided in the interface block S3. When the retaining unit 4 is provided in the interface block S3, however, it is necessary to use the interface-block transfer mechanism B to access the retaining unit 4, making the load of the interface-block transfer mechanism B larger. It is therefore preferable that the retaining unit 4 be provided at a position where the main transfer mechanisms A1 to A5 in each of the unit blocks B1 to B5 can access.

In the present invention, as long as each unit block includes the liquid processing unit, the heating unit, the cooling unit, and the main transfer mechanism, the number and types of those units (modules) and their layouts are not limited to those of the above-described embodiment. The transfer stage TRS of the shelf unit that can be accessed by the carrier-block transfer mechanism is not limited to the transfer stage which is located at a position corresponding to the DEV layer B1, B2, and it may be the transfer stage which is located at a position that enables the transfer of the wafer W between the carrier-block transfer mechanism and one or more unit blocks stacked one on another. Regarding the shelf unit U6, the dedicated second transfer stage TRS may be provided transferring the wafer W to and from the interface-block transfer mechanism B, so that the wafer W is transferred between each of the unit blocks B1 to B5 and the interface block S3 through that second transfer stage TRS and the second sub-transfer mechanism D2.

The transfer of the wafer W between the unit blocks for the coating-film formation may be carried out by any arm of the first and second sub-transfer mechanism D1 and D2. Regarding the modules in the DEV layers B1 and B2, the common main transfer mechanism may be used to transfer the wafer W. The number of the transfer stages TRS of the shelf unit U5, U6 should be greater than or equal to one. The transfer stage TRS may have a cooling function or any module other than the transfer stage TRS, for example, the cooling unit may be provided.

Although the foregoin description of the embodiment has been given of the case where a semiconductor wafer is used as a substrate, the present invention is not limited to this particular case, and can be adapted to a coating and developing apparatus which processes other types of substrates like a flat panel display (FPD) substrate typified by a glass substrate for a liquid crystal display.

What is claimed is:

1. A coating and developing apparatus comprising:
   a carrier block for carrying in and out a carrier on which a plurality of substrates are mountable;
   a process block in which a substrate in said carrier carried into said carrier block is transferred, and which forms a coating film including a resist film on a substrate, develops said coating film after exposure, and performs a heat processing accompanying those film formation and development; and
   an interface block, provided between said process block and an exposure apparatus which performs an exposure process on said coating film formed on a substrate, for transferring the substrate between said process block and said exposure apparatus,
   wherein after the coating film including the resist film is formed on a substrate transferred to said process block from said carrier, the substrate is transferred to said exposure apparatus via said interface block, and the substrate after exposure is returned to said process block via said interface block and is subjected to a developing process in said process block, after which the substrate is transferred to said carrier block,
   said process block includes a unit block for coating-film formation or a stack of plural unit blocks for coating-film formation, and a unit block for development stacked on said unit block for coating-film formation or said plural unit blocks for coating-film formation,
   said unit block for coating-film formation or each of said unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of said unit blocks for coating-film formation and retainable substrates whose quantity corresponds to a number of substrates retainable in that unit block, and
   said coating and developing apparatus further comprises a second transfer mechanism, intervened between said process block and said exposure apparatus, for transferring a substrate therebetween, and a control device which, upon occurrence of an abnormality in said second transfer mechanism, outputs a control instruction to control said first transfer mechanism in said unit block for coating-film formation in such a way that those substrates which are present in that unit block for coating-film formation retreat to said first substrate retaining section after an ordinary process is performed in said unit block for coating-film formation, and inhibit transfer of any substrate into said unit block for coating-film formation.

2. The coating and developing apparatus according to claim 1, further comprising a second substrate retaining section for retreat, provided at said unit block for development and retainable substrates whose quantity corresponds to a number of substrates retainable in that unit block, and a third transfer mechanism which carries out substrates after development from said unit block for development, and
   wherein upon occurrence of an abnormality in said third transfer mechanism, said control device outputs a control instruction to control said first transfer mechanism in said unit block for development in such a way that those substrates which are present in that unit block for development retreat to said second substrate retaining section after an ordinary process is performed in said unit block for development, and inhibit transfer of any substrate into said unit block for development.

3. The coating and developing apparatus according to claim 1, wherein said plural unit blocks for coating-film formation stacked one on another include a unit block for applying a resist liquid to a substrate, and a unit block for applying a chemical liquid for an antireflection film to a substrate before applying said resist liquid.

4. The coating and developing apparatus according to claim 1, wherein said plural unit blocks for coating-film formation stacked one on another include a unit block for applying a resist liquid to a substrate, and a unit block for applying a chemical liquid for an antireflection film to a substrate after applying said resist liquid.

5. The coating and developing apparatus according to claim 1, wherein said plural unit blocks for coating-film formation stacked one on another include a unit block for applying a resist liquid to a substrate, a unit block for applying a chemical liquid for an antireflection film to a substrate before applying said resist liquid, and a unit block for applying a chemical liquid for an antireflection film to a substrate after applying said resist liquid.

6. The coating and developing apparatus according to claim 1, wherein said unit block for coating-film formation has a plurality of modules on which substrates are to be mounted and whose transfer order has been determined, said first transfer mechanism has two transfer arms, takes out a substrate from one of said plurality of modules with one of said transfer arms, receives another substrate present in a next module with the other transfer arm, transfers said former substrate on said one transfer arm to said next module, repeats those operations to move a substrate placed on each module to a module succeeding that module by one to thereby execute one transfer cycle, goes to a next transfer cycle after said one transfer cycle is executed, and executes individual transfer cycles in order to sequentially transfer substrates to said plurality of modules in said transfer order, so that a predetermined coating-film forming process is performed on said substrates, and
   said control device comprises:
   a memory section which stores a transfer schedule in a unit block for coating-film formation, which is prepared by arranging transfer cycle data, designating a transfer cycle in association with an order assigned to substrates and modules in that unit block for coating-film formation, in a time sequential manner;
   a rewriting section which rewrites a last module in said transfer schedule in said first substrate retaining section when an abnormality occurs in said second transfer mechanism; and
   transfer control section which controls transfer of substrates by said first transfer mechanism in said unit block for coating-film formation according to said transfer schedule or a rewritten transfer schedule.

7. The coating and developing apparatus according to claim 2, wherein said unit block for development has a plurality of modules on which substrates are to be mounted and whose transfer order has been determined, said first transfer mechanism has two transfer arms, takes out a substrate from one of said plurality of modules with one of said transfer arms, receives another substrate present in a next module with the other transfer arm, transfers said former substrate on said one transfer arm to said next module, repeats those operations to move a substrate placed on each module to a module succeeding that module by one to thereby execute one transfer cycle, goes to a next transfer cycle after said one transfer cycle is executed, and executes individual transfer cycles in order to sequentially transfer substrates to said plurality of modules in said transfer order, so that a predetermined coating-film forming process is performed on said substrates, and said control device comprises:
  a memory section which stores a transfer schedule in a unit block for coating-film formation, which is prepared by arranging transfer cycle data, designating a transfer cycle in association with an order assigned to substrates and modules in that unit block for coating-film formation, in a time sequential manner;
  a rewriting section which rewrites a last module in said transfer schedule in said second substrate retaining section when an abnormality occurs in said third transfer mechanism; and
  transfer control section which controls transfer of substrates by said first transfer mechanism in said unit block for development according to said transfer schedule or a rewritten transfer schedule.

8. A coating and developing method which performs a coating and developing process using a coating and developing apparatus comprising:
  a carrier block for carrying in and out a carrier on which a plurality of substrates are mountable;
  a process block in which a substrate in said carrier carried into said carrier block is transferred, and which forms a coating film including a resist film on the substrate, develops said coating film after exposure, and performs a heat processing accompanying those film formation and development; and
  an interface block, provided between said process block and an exposure apparatus which performs an exposure process on a coating film formed on a substrate, for transferring the substrate between said process block and said exposure apparatus,
  wherein said process block includes a unit block for coating-film formation or a stack of plural unit blocks for coating-film formation, and a unit block for development stacked on said unit block for coating-film formation or said plural unit blocks for coating-film formation,
  said unit block for coating-film formation or each of said unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of said unit blocks for coating-film formation and retainable substrates whose quantity corresponds to a number of substrates retainable in that unit block, and
  said coating and developing apparatus further comprises a second transfer mechanism, intervened between said process block and said exposure apparatus, for transferring a substrate therebetween,
  said method comprising:
  transferring a substrate into said process block from said carrier;
  forming a coating film including a resist film on the substrate in said unit block for coating-film formation;
  transferring the substrate to said exposure apparatus via said interface block;
  returning a substrate after exposure to said process block via said interface block; and
  performing a developing process in said unit block for coating-film formation;
  wherein upon occurrence of an abnormality in said second transfer mechanism, an ordinary process in said unit block for coating-film formation is performed on those substrates which are present in that unit block for coating-film formation, individual substrates are retreated to said first substrate retaining section for retreat provided in said unit block for coating-film formation, and transfer of any substrate into said unit block for coating-film formation is inhibited.

9. The coating and developing method according to claim 8, wherein said coating and developing apparatus further comprises a second substrate retaining section for retreat, provided at said unit block for development and retainable substrates whose quantity corresponds to a number of substrates retainable in that unit block, and a third transfer mechanism which carries out substrates after development from said unit block for development, and
  wherein upon occurrence of an abnormality in said third transfer mechanism, an ordinary process in said unit block for development is performed on those substrates which are present in that unit block for development, individual substrates are retreated to said second substrate retaining section for retreat provided in said unit block for development, and transfer of any substrate into said unit block for development is inhibited.

10. A computer readable storage medium containing software which, when executed, causes a computer to control a coating and developing apparatus comprising:
  a carrier block for carrying in and out a carrier on which a plurality of substrates are mountable;
  a process block in which a substrate in said carrier carried into said carrier block is transferred, and which forms a coating film including a resist film on the substrate, develops the coating film after exposure, and performs a heat processing accompanying those film formation and development; and
  an interface block, provided between said process block and an exposure apparatus which performs an exposure process on a coating film formed on a substrate, for transferring the substrate between said process block and said exposure apparatus,
  wherein said process block includes a unit block for coating-film formation or a stack of plural unit blocks for coating-film formation, and a unit block for development stacked on said unit block for coating-film formation or said plural unit blocks for coating-film formation,
  said unit block for coating-film formation or each of said unit blocks for coating-film formation includes a liquid process unit which applies a chemical liquid to a substrate, a heating unit which heats a substrate, a cooling unit which cools a substrate, a first transfer mechanism which transfers a substrate between those units, and a first substrate retaining section for retreat, provided at each of said unit blocks for coating-film formation and retainable substrates whose quantity corresponds to a number of substrates retainable in that unit block, and
  said coating and developing apparatus further comprises a second transfer mechanism, intervened between said process block and said exposure apparatus, for transferring a substrate therebetween, wherein said software causes said computer to control said coating and developing apparatus in such a way that upon occurrence of an abnormality in said second transfer mechanism, an ordinary process in said unit block for coating-film formation is performed on those substrates which are present in that unit block for coating-film formation, individual substrates are retreated to said first substrate retaining section for retreat provided in said unit block for coating-film formation, and transfer of any substrate into said unit block for coating-film formation is inhibited.

11. The computer readable storage medium according to claim 10, wherein said coating and developing apparatus further comprises a second substrate retaining section for retreat, provided at said unit block for development and retainable substrates whose quantity corresponds to a number of substrates retainable in that unit block, and a third transfer mechanism which carries out substrates after development from said unit block for development, and wherein said software causes said computer to control said coating and developing apparatus in such a way that upon occurrence of an abnormality in said third transfer mechanism, an ordinary process in said unit block for development is performed on those substrates which are present in that unit block for development, individual substrates are retreated to said second substrate retaining section for retreat provided in said unit block for development, and transfer of any substrate into said unit block for development is inhibited.

* * * * *